United States Patent
Uenoyama et al.

(10) Patent No.: US 8,950,897 B2
(45) Date of Patent: Feb. 10, 2015

(54) LIGHT-EMITTING DEVICE AND LIGHTING APPARATUS

(71) Applicant: Panasonic Corporation, Osaka (JP)

(72) Inventors: Koji Uenoyama, Kyoto (JP); Atusi Ootubo, Osaka (JP); Hiroyuki Matsumoto, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/823,478

(22) PCT Filed: Oct. 18, 2012

(86) PCT No.: PCT/JP2012/006668
§ 371 (c)(1),
(2) Date: Mar. 14, 2013

(87) PCT Pub. No.: WO2013/076910
PCT Pub. Date: May 30, 2013

(65) Prior Publication Data
US 2014/0111991 A1    Apr. 24, 2014

(30) Foreign Application Priority Data

Nov. 21, 2011    (JP) ................ 2011-254085

(51) Int. Cl.
*F21S 4/00*    (2006.01)
*F21V 21/00*    (2006.01)
(Continued)

(52) U.S. Cl.
CPC ............ *F21V 29/004* (2013.01); *H05K 1/0209* (2013.01); *H05K 1/0271* (2013.01);
(Continued)

(58) Field of Classification Search
CPC ........ F21V 29/00; F21V 29/246; F21V 19/00; F21V 23/00; F21S 2/00; F21S 8/04; F21Y 2101/02; H01L 33/00
USPC ........ 362/249.01, 221, 294, 249.02; 174/252, 174/262
See application file for complete search history.

(56) References Cited

U.S. PATENT DOCUMENTS 6,857,767 B2    2/2005    Matsui et al.
7,258,463 B2 *  8/2007    Sloan et al. .................. 362/231
(Continued)

FOREIGN PATENT DOCUMENTS

CN    1769762    5/2006
CN    1877833    12/2006
(Continued)

OTHER PUBLICATIONS

Translation of "Sharp", JP 2009-004129, published Aug. 1, 2009.*
(Continued)

*Primary Examiner* — Peggy Neils
*Assistant Examiner* — William N Harris
(74) *Attorney, Agent, or Firm* — Greenblum & Bernstein, P.L.C.

(57) ABSTRACT

A light-emitting device includes: a board; light-emitting elements interconnected in parallel and provided above a top face of the board; light-emitting elements, one of which is connected in series with the light-emitting element and the other of which is connected in series with the light-emitting element, the light-emitting elements being interconnected in parallel; a metal pattern provided continuously under the light-emitting elements, on an undersurface of the board; and a metal pattern provided continuously under the light-emitting elements, and isolated from the first metal pattern.

17 Claims, 19 Drawing Sheets

(51) Int. Cl.
| | | |
|---|---|---|
| *F21V 29/00* | (2006.01) | |
| *H05K 1/00* | (2006.01) | |
| *H05K 1/02* | (2006.01) | |
| *F21K 99/00* | (2010.01) | |
| *F21S 8/04* | (2006.01) | |
| *F21Y 101/02* | (2006.01) | |
| *F21Y 103/02* | (2006.01) | |
| *F21V 3/00* | (2006.01) | |
| *H05B 33/08* | (2006.01) | |

(52) U.S. Cl.
CPC ... *F21K 9/17* (2013.01); *F21S 8/04* (2013.01); *F21Y 2101/02* (2013.01); *F21Y 2103/022* (2013.01); *F21V 3/00* (2013.01); *F21K 9/1355* (2013.01); *H05K 2201/10106* (2013.01); *H05K 2201/09136* (2013.01); *H05K 2201/09781* (2013.01); *H05B 33/0821* (2013.01)
USPC .............. 362/249.01; 362/221; 362/249.02; 362/294; 174/252

(56) References Cited

U.S. PATENT DOCUMENTS

| | | | |
|---|---|---|---|
| 7,394,398 B2 * | 7/2008 | Pederson | 340/815.45 |
| 7,495,322 B2 | 2/2009 | Hashimoto et al. | |
| 7,518,148 B2 | 4/2009 | Liu et al. | |
| 7,709,282 B2 | 5/2010 | Fukshima et al. | |
| 7,717,589 B2 | 5/2010 | Nishioka et al. | |
| 7,956,372 B2 | 6/2011 | Kamada et al. | |
| 8,232,709 B2 | 7/2012 | Betsuda et al. | |
| 8,378,361 B2 | 2/2013 | Takeuchi et al. | |
| 8,421,094 B2 * | 4/2013 | Ishizaki et al. | 257/88 |
| 2003/0072153 A1 * | 4/2003 | Matsui et al. | 362/231 |
| 2006/0098440 A1 | 5/2006 | Allen | |
| 2006/0226522 A1 | 10/2006 | Liu et al. | |
| 2008/0143916 A1 * | 6/2008 | Fujino et al. | 349/58 |
| 2011/0089805 A1 | 4/2011 | Betsuda et al. | |
| 2011/0180817 A1 | 7/2011 | Ishizaki et al. | |
| 2011/0254023 A1 | 10/2011 | Shibusawa et al. | |
| 2013/0193462 A1 | 8/2013 | Ishizaki et al. | |

FOREIGN PATENT DOCUMENTS

| | | |
|---|---|---|
| CN | 101194538 | 6/2008 |
| CN | 102157506 | 8/2011 |
| EP | 2315284 | 4/2011 |
| EP | 2381157 | 10/2011 |
| JP | 2003-092011 | 3/2003 |
| JP | 2007-035890 | 2/2007 |
| JP | 2009-4129 | 1/2009 |
| WO | 2006/104544 | 10/2006 |
| WO | 2008/156020 | 12/2008 |

OTHER PUBLICATIONS

"LED everywhere at home, vol. 2", Toshiba lighting & technology corporation, Appliance project department, Jun. 2011, pp. 10-11.
Decision to Grant a Patent, mail date is Apr. 9, 2013, along with an English language translation thereof.
China Office action, mail date is Nov. 29, 2013 along with English translation thereof.
Search report from E.P.O., mail date is Jul. 16, 2014.

* cited by examiner

U.S. 8,950,897 B2

LIGHT-EMITTING DEVICE AND LIGHTING APPARATUS

TECHNICAL FIELD

The present invention relates to a light-emitting device and a lighting apparatus, and particularly relates to a light-emitting device using light emitting diodes (LEDs) and a lighting apparatus having the light-emitting device.

BACKGROUND ART

Because of their high efficiency and long life, LEDs are expected to be used as the next generation of light-emitting elements in various light-emitting devices. Therefore, research and development for light-emitting devices using LEDs are being undertaken.

As a lighting apparatus having such a light-emitting device, a lighting apparatus having, in the body, a power block that converts a commercial power supply to DC output and four LED units (light-emitting devices) that have LEDs provided on a printed circuit board (e.g., see Non Patent Literature 1) is known.

In a lighting device recited in Non Patent Literature 1, a light-emitting device has a fan shape, and four light-emitting devices are combined into a circular shape. Each light-emitting device has four series circuits in which 12 LEDs are connected in series on or above a board, and the four series circuits are connected in parallel in each light-emitting device.

CITATION LIST

Non Patent Literature

[NPL 1] Toshiba lighting & technology corporation, Appliance project department, *LED everywhere at home*, Vol. 2, pp. 10 to 11 (June 2011).

SUMMARY OF INVENTION

Technical Problem

In manufacturing of light-emitting devices, a reflow process is generally performed to mount LEDs on a board. Application of heat to the board in this reflow process may cause the board to expand.

In this case, the difference in thermal expansion coefficients of a mounting surface of the board on which LEDs are mounted and an attaching surface to which the device body is attached causes warpage and distortion of the board. This deteriorates the adhesion between the board and the device body. As a result, the heat conduction from the LEDs to the device body is inhibited, and an abnormal increase in temperature of the LEDs is induced. When several LEDs are connected in parallel above the mounting surface of the board, temperature rise is caused for each of the LEDs connected in parallel. However, the levels of temperature rise differ between the LEDs. This causes variation in current characteristics and voltage characteristics, and thus causes variation in a current between parallel-connection paths.

The variation in a current between parallel-connection paths as mentioned above causes variation in brightness of luminescence between the parallel-connection paths and variation in life of the LEDs. Especially, internal resistance of the LEDs decreases as temperature rises in the LEDs. Therefore, a current concentrates on a specific path having the lowest internal resistance, and the temperature in the LEDs further increases. As a result, the specific internal path has a life shorter than those of other paths, and only the LEDs in the specific path stop emitting light.

The present invention has been conceived in order to solve the problems, and it is an object of the present invention to provide a light-emitting device and a lighting apparatus which can equalize the rise in temperature of light-emitting elements connected in parallel.

Solution to Problem

To solve the above problem, a light-emitting device according to an aspect of the present invention includes: a board; a first light-emitting element and a second light-emitting element interconnected in parallel and provided above a top face of the board; a third light-emitting element and a fourth light-emitting element, one of which is connected in series with the first light-emitting element and the other of which is connected in series with the second light-emitting element, the third light-emitting element and the fourth light-emitting element being interconnected in parallel and provided above the top face of the board; a first metal pattern provided continuously under the first light-emitting element and the second light-emitting element, on an undersurface of the board; and a second metal pattern provided continuously under the third light-emitting element and the fourth light-emitting element, on the undersurface of the board, and isolated from the first metal pattern.

Here, the third light-emitting element may be connected in series with the first light-emitting element and in parallel with the second light-emitting element, and the fourth light-emitting element may be connected in series with the second light-emitting element and in parallel with the first light-emitting element.

Moreover, the light-emitting device may include: a fifth light-emitting element provided above the top face of the board, and connected in series with the first light-emitting element and in parallel with the second light-emitting element; and a sixth light-emitting element provided above the top face of the board, and connected in series with the second light-emitting element and in parallel with the first light-emitting element and the fifth light-emitting element, in which the first metal pattern may be provided continuously below the first light-emitting element, the second light-emitting element, the fifth light-emitting element, and the sixth light-emitting element.

Moreover, the light-emitting device may include a plurality of parallel connection units each including the first light-emitting element and the second light-emitting element, in which the parallel connection units may be provided between different pairs of terminals, and the first metal pattern may be provided continuously under the parallel connection units.

Moreover, a parallel connection unit of the first light-emitting element and the second light-emitting element may be connected in series with a parallel connection unit of the third light-emitting element and the fourth light-emitting element.

Moreover, the light-emitting device may further include: a fifth light-emitting element provided above the top face of the board, and connected in series with the first light-emitting element and in parallel with the second light-emitting element; a sixth light-emitting element provided above the top face of the board, and connected in series with the second light-emitting element and in parallel with the first light-emitting element and the fifth light-emitting element; and a third metal pattern provided continuously under the fifth light-emitting element and the sixth light-emitting element, on the undersurface of the board, and isolated from the first metal pattern and the second metal pattern.

Moreover, the light-emitting device may further include: a fifth light-emitting element and a sixth light-emitting element provided above the top face of the board, and connected in series with the parallel connection unit of the first light-emitting element and the second light-emitting element, the fifth light-emitting element and the sixth light-emitting element being interconnected in parallel; and a third metal pattern provided continuously under the fifth light-emitting element and the sixth light-emitting element, on the undersurface of the board, and isolated from the first metal pattern and second metal pattern.

Moreover, the light-emitting device may further include a fifth light-emitting element and a sixth light-emitting element provided above the top face of the board, and connected in series with the parallel connection unit of the first light-emitting element and the second light-emitting element, the fifth light-emitting element and the sixth light-emitting element being interconnected in parallel, in which the first metal pattern may be provided continuously below the first light-emitting element, the second light-emitting element, the fifth light-emitting element and a sixth light-emitting element.

Moreover, the light-emitting device may further include a plurality of parallel connection units each including the first light-emitting element and the second light-emitting element, in which the parallel connection units may be connected in parallel, and the first metal pattern may be provided continuously under the parallel connection units.

Moreover, the light-emitting device may further include wiring patterns and terminals provided on the top face of the board to supply electric power to the first light-emitting element, the second light-emitting element, the third light-emitting element and the fourth light-emitting element, in which the first metal pattern and the second metal pattern may be dielectrically isolated from the wiring patterns.

Moreover, a total area of metal patterns on the top face of the board including the wiring patterns and the terminals may be substantially equal to a total area of metal patterns on the undersurface of the board including the first metal pattern and the second metal pattern.

Moreover, a thickness of metal patterns on the top face of the board including the wiring patterns and the terminals may be substantially equal to a thickness of metal patterns on the undersurface of the board including the first metal pattern and the second metal pattern.

Moreover, the first metal pattern and the second metal pattern may be aligned in a longitudinal direction of the board.

Moreover, the first metal pattern and the second metal pattern may be aligned in a direction perpendicular to a fiber direction of the board.

Moreover, a lighting apparatus according to an aspect of the present invention includes the above light-emitting device.

A lighting apparatus according to an aspect of the present invention includes: a light-emitting device; and a base provided with the light-emitting device, the light-emitting device including: a board; a first light-emitting element and a second light-emitting element interconnected in parallel and provided above a top face of the board; and a third light-emitting element and a fourth light-emitting element, one of which is connected in series with the first light-emitting element and the other of which is connected in series with the second light-emitting element, the third light-emitting element and the fourth light-emitting element being interconnected in parallel and provided above the top face of the board, the base including: a first metal pattern provided continuously under the first light-emitting element and the second light-emitting element, on a surface with which a undersurface of the board of the light-emitting device is in contact; and a second metal pattern provided continuously under the third light-emitting element and the fourth light-emitting element, and isolated from the first metal pattern.

Advantageous Effects of Invention

According to the present invention, the occurrence of the warpage of a board is reduced, and it is possible to equalize temperature rise in light-emitting devices connected in parallel.

DESCRIPTION OF EMBODIMENTS

Figure 1:
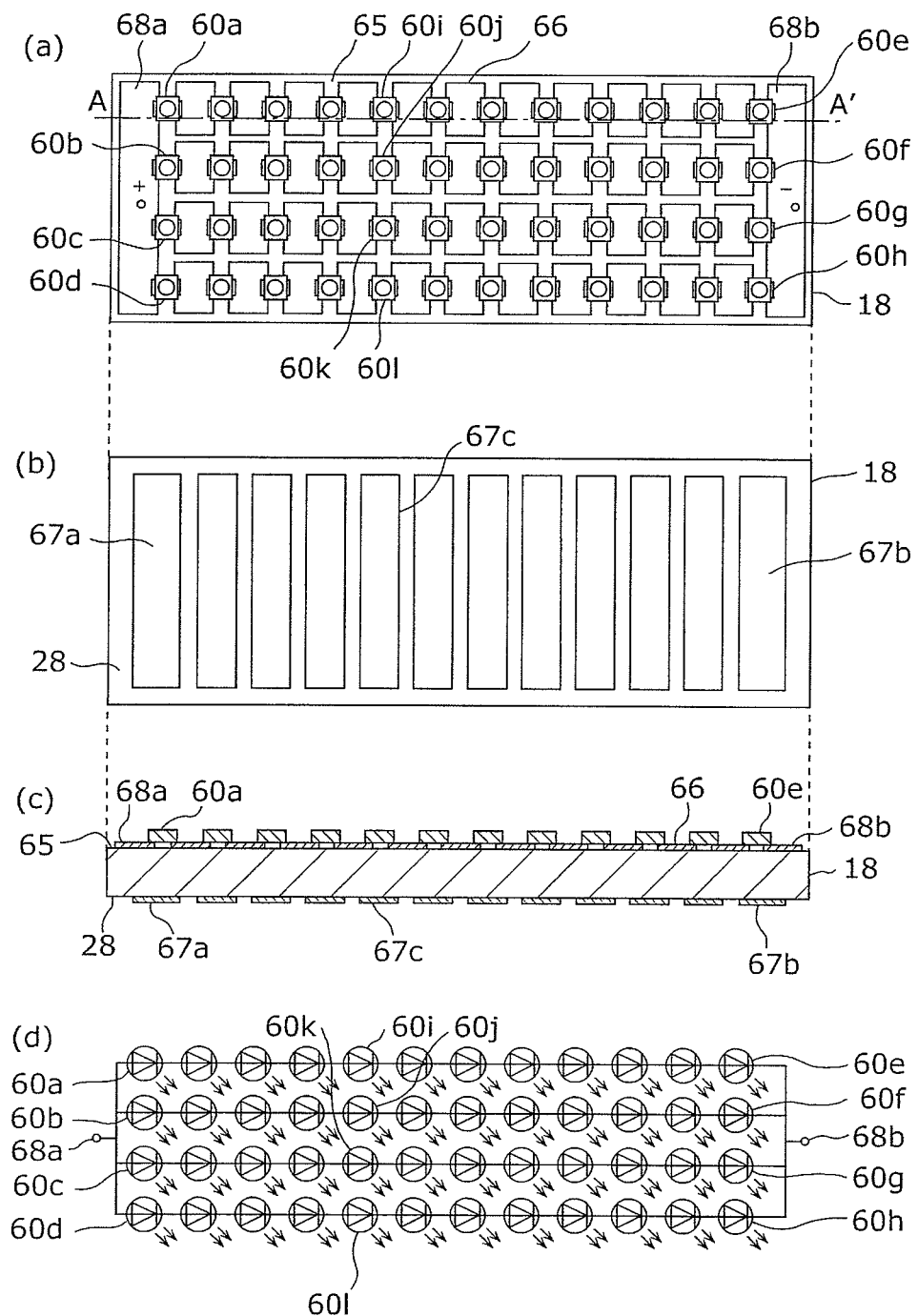
FIG. 1 illustrates a configuration of a light-emitting device according to the first embodiment of the present invention.

The following describes the embodiments of the present invention with reference to the drawings. It should be noted that each of the embodiments described below describes a preferable specific example of the present invention. The numerical values, shapes, materials, structural elements, the arrangement and connection of the structural elements, steps, the processing order of the steps and so on shown in the following embodiments are mere examples, and are not intended to limit the present invention. The scope of the present invention is defined by the appended claims. Therefore, among the structural elements in the following embodiments, structural elements not recited in any one of the independent claims representing superordinate concept are not necessarily required to achieve the problem of the present invention, but are required to form a more preferable embodiments. Moreover, the same reference numerals are given to the same elements representing the substantially the same structure, operation and effect.

Embodiment 1

FIG. 1 illustrates a configuration of a light-emitting device according to the present embodiment. It should be noted that FIG. 1 (*a*) is a top view of the light-emitting device (plan view of the top face of a board). FIG. 1 (*b*) is a bottom view of the light-emitting device (plan view of the undersurface of the board). Moreover, FIG. 1 (*c*) is a cross-sectional view of the light-emitting device (cross-sectional view taken along the line A-A" in FIG. 1 (*a*)). FIG. 1 (*d*) is a circuit diagram illustrating a circuitry of the light-emitting device.

This light-emitting device is a light-emitting module (light-emitting unit) that is a light source of a lighting apparatus. The light-emitting device includes a board 18, light-emitting elements 60*a* to 60*l* provided above a top face 65 (main surface on one side) of the board 18, wiring patterns 66 and terminals 68*a* and 69*b*, metal patterns (heat radiation patterns) 67*a* to 67*c* provided on a undersurface 28 (main surface on the other side) of the board 18.

At least the top face 65 of the board 18 is made of an insulating material. The light-emitting elements 60*a* to 60*l* are mounted above the board 18. The board 18 may be, for example, a long rectangular board. Examples of the board 18 are a glass composite board (e.g., CEM-3), a glass epoxy board (e.g., FR-4), a paper phenol or a paper epoxy board (e.g., FR-1), and a flexible board having flexibility and comprising polyimide. Examples of a metal-based board are an aluminum alloy board on the surface of which an insulating film is formed, a ferroalloy board, a copper alloy board, and so on.

The fiber direction of the board 18 is in parallel with the lateral direction of the board 18. Here, thermal expansion coefficients in the top face 65 and the undersurface 28 of the board 18 may be matched. By doing so, the warpage of the board 18 can be reduced.

The light-emitting elements 60*a* to 60*l* are packages of LED chips (LEDs) and phosphors, that is, SMD light-emitting elements such as white LED elements that emit white light. The light-emitting elements 60*a* to 60*l* include a package (cavity), LEDs mounted on the bottom of the recess of the package, a sealing material made of phosphor-containing resin that seals the LEDs and filled in the recess of the package, and a metal wiring.

All the light-emitting elements including the light-emitting elements 60*a* to 60*l* (hereinafter simply referred to as "the light-emitting elements") are arranged such that 12 light-emitting elements are connected in series to form a series connection unit (series circuit) and four such series connection units are connected in parallel in the circuit. Light-emitting elements aligned in the longitudinal direction of the board 18 among the light-emitting elements form the series connection unit. Four series connection units connected in parallel are aligned in the lateral direction of the board 18. Therefore, light-emitting elements are arrayed in a matrix above the top face 65 of the board 18.

More specifically, the light-emitting elements 60*a*, 60*i*, and 60*e* among the light-emitting elements are aligned in the longitudinal direction of the board 18 to form one series connection unit. Likewise, the light-emitting elements 60*b*, 60*j*, and 60*f* among the light-emitting elements are aligned in the longitudinal direction of the board 18 to form another series connection unit. Moreover, the light-emitting elements 60*c*, 60*k*, and 60*g* among the light-emitting elements are aligned in the longitudinal direction of the board 18 to form yet another series connection unit. The light-emitting elements 60*d*, 60*l*, and 60*h* among the light-emitting elements are aligned in the longitudinal direction of the board 18 to form yet further another series connection unit. These four series connection units are connected in parallel to form one parallel connection unit (parallel circuit).

It should be noted that the light-emitting elements 60*a*, 60*b*, 60*c*, and 60*d* are examples of a first light-emitting element and a second light-emitting element. The light-emitting elements 60*e*, 60*f*, 60*g*, and 60*h* are examples of a third light-emitting element and a fourth light-emitting element. The light-emitting element 60*i*, 60*j*, 60*k*, and 60*l* are examples of a fifth light-emitting element and a sixth light-emitting element.

The terminals 68*a* and 68*b* are wiring patterns (metal patterns) provided on separate sides in the longitudinal direction of the board 18, and power-receiving units (external connection terminals) that receive direct-current power from outside and supply the direct-current power to the light-emitting elements. The surfaces of the terminals 68*a* and 68*b* are exposed. The terminals 68*a* and 68*b* are electrically connected to the light-emitting elements via the wiring patterns 66. When the direct-current voltage received by the terminals 68*a* and 68*b* is supplied to the light-emitting elements, the light-emitting elements emit desired light. The terminals 68*a* and 68*b* can be formed in the same process (same mask pattern), and it is possible to fabricate the terminals 68*a* and 68*b* having substantially the same thicknesses.

The wiring pattern (metal pattern) 66 is a metal wiring comprising tungsten (W) or copper (Cu). The surface of the wiring patterns 66 is exposed. The wiring pattern 66 is patterned into a predetermined shape in order to electrically connect light-emitting elements included in series connection units among the light-emitting elements. The wiring patterns 66 are independently formed in a shape of an island, between the light-emitting elements included in the series connection units among the light-emitting elements. The number of the wiring patterns 66 totals 44. The wiring patterns 66 can be formed in the same process and it is possible to fabricate the wiring patterns 66 having substantially the same thicknesses. Moreover, the wiring patterns 66 can be formed in the same process as the terminals 68a and 68b, and it is possible to make the thickness of the wiring patterns 66 the substantially the same thickness as the terminals 68a and 68b.

Metal patterns 67a to 67c are made of metal material (metal film) comprising tungsten (W) or copper (Cu). The surfaces of the metal patterns 67a to 67c are exposed. The metal patterns 67a to 67c serve as heat radiation parts for radiating heat generated by light emission of the light-emitting elements. The metal patterns 67a to 67c are patterned on the undersurface 28 of the board 18 to be attached to a lighting apparatus when the light-emitting device is attached to the lighting apparatus. The metal patterns 67a to 67c are dielectrically isolated from the wiring patterns 66, the terminals 68a and 68b, and a voltage source. The metal patterns 67a to 67c do not serve as wirings, but only serve as heat radiation parts.

All the metal patterns including the metal patterns 67a to 67c (hereinafter simply referred to as "the metal patterns") are linear patterns that are provided continuously in the lateral direction of the board 18, and are aligned consecutively in the longitudinal direction of the board 18 (direction perpendicular to the fiber direction of the board 18). It is possible to form, in the same process, the metal patterns having substantially the same thicknesses.

Each of the metal patterns corresponds to a whole area under one column of light-emitting elements connected in parallel which are aligned in the lateral direction of the board 18 among the light-emitting elements. Each of the metal patterns is provided continuously under one column of light-emitting elements connected in parallel, and is thermally connected to the light-emitting elements above the metal pattern. Each of the metal patterns is separately and thermally connected to light-emitting elements connected in series among the light-emitting elements. Therefore, the metal patterns are not formed under areas between the light-emitting elements connected in series among the light-emitting elements, i.e., the wiring patterns 66. Twelve metal patterns are formed to correspond to the number of series connection units of the light-emitting elements.

More specifically, the metal pattern 67a among the metal patterns corresponds to a whole area under the light-emitting elements 60a, 60b, 60c, and 60d. Thus, the metal pattern 67a is thermally connected to the light-emitting elements 60a, 60b, 60c, and 60d. Moreover, the metal pattern 67b among the metal patterns corresponds to a whole area under the light-emitting elements 60e, 60f, 60g, and 60h which are connected in parallel. Thus, the metal pattern 67b is thermally connected to the light-emitting elements 60e, 60f, 60g, and 60h. Moreover, the metal pattern 67c among the metal patterns corresponds to a whole area under the light-emitting elements 60i, 60j, 60k, and 60l which are connected in parallel. Thus, the metal pattern 67c is thermally connected to the light-emitting elements 60i, 60j, 60k, and 60l.

It should be noted that the metal pattern 67a is an example of a first metal pattern. The metal pattern 67b is an example of a second metal pattern. The metal pattern 67c is an example of the third metal pattern.

As mentioned above, a light-emitting device according to the present embodiment includes the board 18, the light-emitting elements 60a and 60b which are provided above the top face 65 of the board 18 and are interconnected in parallel, and the light-emitting elements 60e and 60f interconnected in parallel, one of which is connected in series with the light-emitting element 60a and the other of which is connected in series with the light-emitting element 60b. Moreover, the light-emitting device includes the metal patterns 67a and 67b which are provided on the undersurface 28 of the board 18. Here, the metal pattern 67a is provided continuously under the light-emitting elements 60a and 60b. The metal pattern 67b is provided continuously under the light-emitting elements 60e and 60f. The metal pattern 67b is isolated from the metal pattern 67a.

Moreover, in the light-emitting device according to the present embodiment, the light-emitting element 60e is connected in series with the light-emitting element 60a and is connected in parallel with the light-emitting element 60b. In addition, the light-emitting element 60f is connected in series with the light-emitting element 60b, and connected in parallel with the light-emitting element 60a.

Moreover, the light-emitting device according to the present embodiment includes the wiring patterns 66 and the terminals 68a and 68b for supplying electric power to the light-emitting elements 60a, 60b, 60e, and 60f. Here, the wiring patterns 66 and the terminals 68a and 68b are provided on the top face 65 of the board 18. The metal patterns 67a and 67b are dielectrically isolated from the wiring patterns 66.

Thus, the light-emitting elements 60a and 60b connected in parallel are connected thermally close to each other via the metal pattern 67a immediately under the light-emitting elements 60a and 60b. The light-emitting elements 60e and 60f connected in parallel are connected thermally close to each other via the metal pattern 67b immediately under the light-emitting elements 60e and 60f. Therefore, it is possible to substantially equalize temperature rises between the light-emitting elements connected in parallel. Thus, it is possible to control the occurrence of current variation between parallel-connection paths.

Moreover, the light-emitting elements 60a and 60b connected in parallel are thermally connected via the metal pattern 67a. The light-emitting elements 60e and 60f connected in parallel are thermally connected via the metal pattern 67b. In other words, one metal pattern is divided into several metal patterns in the longitudinal direction of the board 18, i.e., a direction in which warpage tends to occur to form the metal patterns that thermally connect light-emitting elements connected in parallel. Therefore, the warpage of the board 18 can be better controlled, when compared to a case where all the light-emitting elements are thermally connected by one metal pattern. This can improve the cohesion between a light-emitting device and the body of a lighting apparatus to which the light-emitting device is attached. In addition, it is possible to reduce a stress over a soldered portion as a junction of the wiring pattern 66 and light-emitting elements.

Moreover, since the metal patterns on the undersurface of the board 18 equalize temperature rises between the light-emitting elements connected in parallel, it is unnecessary to add to the light-emitting device, a special driving circuit that performs operations such as detection of temperatures in the light-emitting elements and adjustment of the amount of current to be supplied to the light-emitting elements based on the detection result. Therefore, it is possible to achieve a lighting apparatus of a small and simple structure.

Moreover, in a light-emitting device according to the present embodiment, the metal patterns 67a and 67b are aligned in the longitudinal direction of the board 18. This means that the metal patterns 67a and 67b are aligned in a direction perpendicular to the fiber direction of the board 18.

The metal patterns 67a and 67b are separately aligned in the longitudinal direction of the board 18 in which warpage tends to occur. Therefore, the occurrence of warpage of the board 18 can be reduced.

Moreover, in a light-emitting device according to the present embodiment, the metal patterns 67a and 67b are aligned in a direction perpendicular to the fiber direction of the board 18.

As a result, it is possible to match the fiber direction in which warpage tends to occur and the lateral direction of the board 18, and match the longitudinal direction of the board 18 in which warpage tends to occur and the direction in which the metal patterns 67a and 67b are aligned. Therefore, the occurrence of warpage of the board 18 can be reduced.

It should be noted that in the present embodiment, the metal patterns 67a to 67c are each provided continuously under the light-emitting elements adjacent to each other in the lateral direction or the column direction above the top face 65 of the board 18, on the undersurface 28 of the board 18. However, the metal patterns 67a and 67b may be provided continuously under light-emitting elements obliquely adjacent to each other above the top face 65 of the board 18. The metal patterns 67a and 67b may be provided obliquely on the undersurface 28 of the board 18.

[Modification 1]

The following describes a light-emitting device according to the first modification of the present embodiment.

Figure 2:
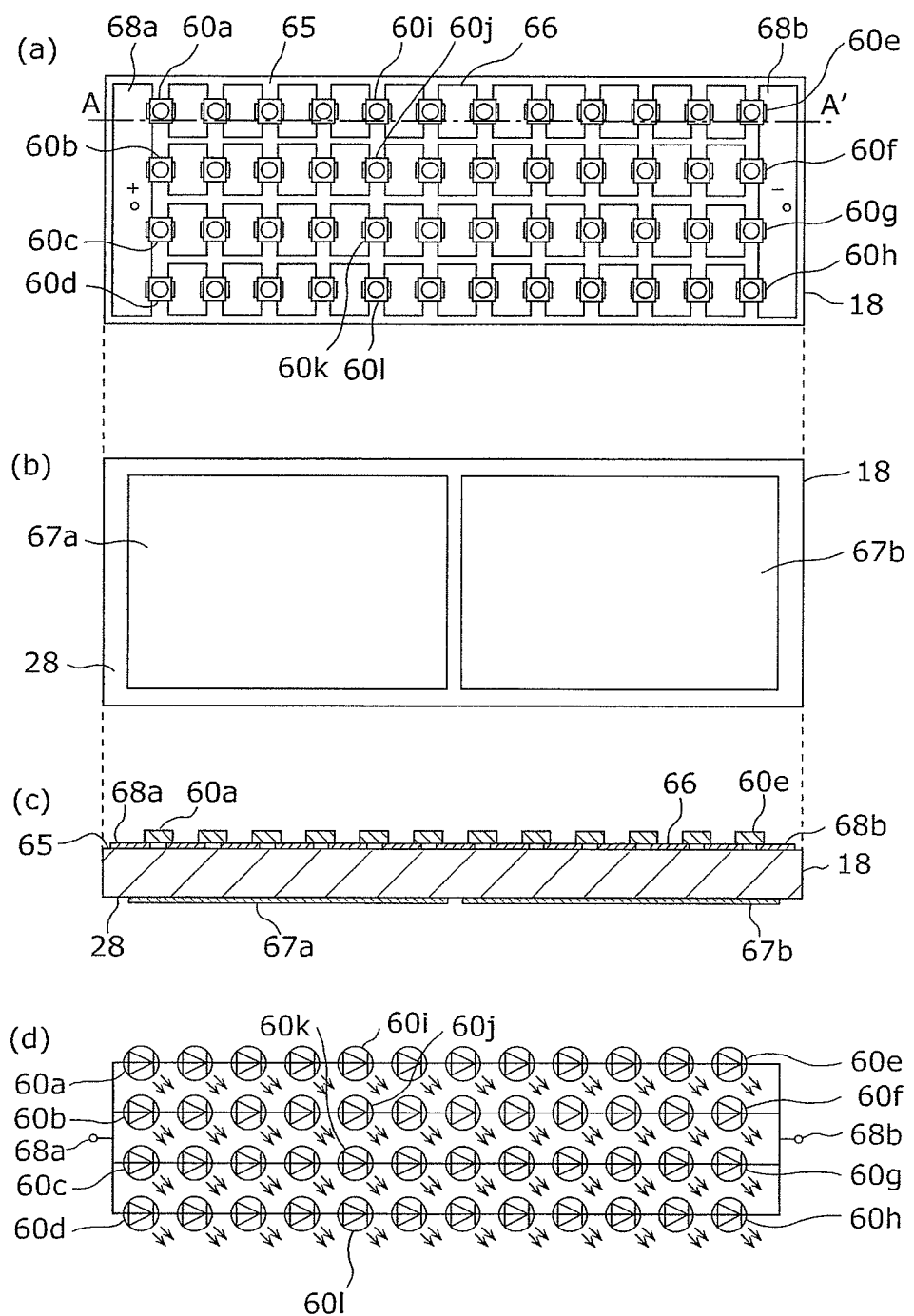
FIG. 2 illustrates a configuration of a light-emitting device according to the first modification of the first embodiment of the present invention.

FIG. 2 illustrates a configuration of a light-emitting device according to the present modification. It should be noted that FIG. 2 (a) is a top view of the light-emitting device (plan view of the top face of a board). FIG. 2 (b) is a bottom view of the light-emitting device (plan view of the undersurface of the board). Moreover, FIG. 2 (c) is a cross-sectional view of the light-emitting device (cross-sectional view taken along the line A-A" in FIG. 2 (a)). FIG. 2 (d) is a circuit diagram illustrating a circuitry of the light-emitting device.

This light-emitting device differs from the light-emitting device of the present embodiment in that one metal pattern not only thermally connects light-emitting elements connected in parallel among the light-emitting elements, but also thermally connects the light-emitting elements connected in series among the light-emitting elements. The following mainly describes differences between this light-emitting device and the light-emitting device according to the present embodiment.

This light-emitting device includes the board 18, the light-emitting elements 60a to 60l provided above the top face 65 of the board 18, the wiring patterns 66 and the terminals 68a and 68b, and the metal patterns 67a and 67b provided on the undersurface 28 of the board 18.

The metal patterns 67a and 67b are rectangular patterns that have four sides parallel to the longitudinal direction or lateral direction of the board 18. The metal patterns 67a and 67b are formed separately in the longitudinal direction of the board 18. In other words, one metal pattern is divided into two metal patterns to form the metal patterns 67a and 67b in the longitudinal direction of the board 18, i.e., a direction in which warpage tends to occur. Each of the metal patterns 67a and 67b corresponds to a whole area below one column of light-emitting elements connected in parallel and aligned in the lateral direction of the board 18 among the light-emitting elements and light-emitting elements connected in series and aligned in the longitudinal direction of the board 18 among the light-emitting elements. Thus, the metal pattern is thermally connected to the light-emitting elements above the metal pattern. Therefore, the metal patterns are different from the metal patterns of the present embodiment in that the metal patterns of the first modification are also formed under the wiring patterns 66. Moreover, only two metal patterns are formed and the metal pattern 67c is not formed.

More specifically, the metal pattern 67a among the metal patterns corresponds to a whole area below the light-emitting elements 60a, 60b, 60c, and 60d and the light-emitting elements 60i, 60j, 60k, and 60l. The metal pattern 67a is thermally connected to the light-emitting elements 60a, 60b, 60c, and 60d and the light-emitting elements 60i, 60j, 60k, and 60l. On the other hand, the metal pattern 67b among the metal patterns corresponds to a whole area below the light-emitting elements 60e, 60f, 60g, and 60h connected in parallel. The metal pattern 67b is thermally connected to the light-emitting elements 60e, 60f, 60g, and 60h.

As mentioned above, according to the light-emitting device of the present modification, it is possible to suppress current variation in parallel-connection paths, for a similar reason for the light-emitting device of the present embodiment. Moreover, a stress over the light-emitting elements and a soldered portion can be reduced. Furthermore, a lighting apparatus of a small and simple structure can be achieved.

Moreover, the light-emitting device according to the present modification includes the light-emitting elements 60i and 60j provided above the top face 65 of the board 18. The light-emitting element 60i is connected in series with the light-emitting element 60a, and is connected in parallel with the light-emitting element 60b. The light-emitting element 60j is connected in series with the light-emitting element 60b, and is connected in parallel with the first light-emitting element 60a and the light-emitting element 60i. The metal pattern 67a is provided continuously under the light-emitting elements 60a, 60b, 60i, and 60j.

Thus, the metal pattern 67a not only thermally connects the light-emitting elements 60a and 60b connected in parallel, but also thermally connects the light-emitting elements 60a and 60i connected in series or the light-emitting elements 60b and 60j connected in series. Therefore, it is possible to substantially equalize temperature rises in the light-emitting elements connected in series.

It should be noted that in the light-emitting device according to the present modification, the metal patterns 67a and 67b are rectangular patterns. However, the metal patterns 67a and 67b may be patterns of shapes such as a trapezoid, a polygon, and a circle.

[Modification 2]

The following describes a light-emitting device according to the second modification of the present embodiment.

Figure 3:
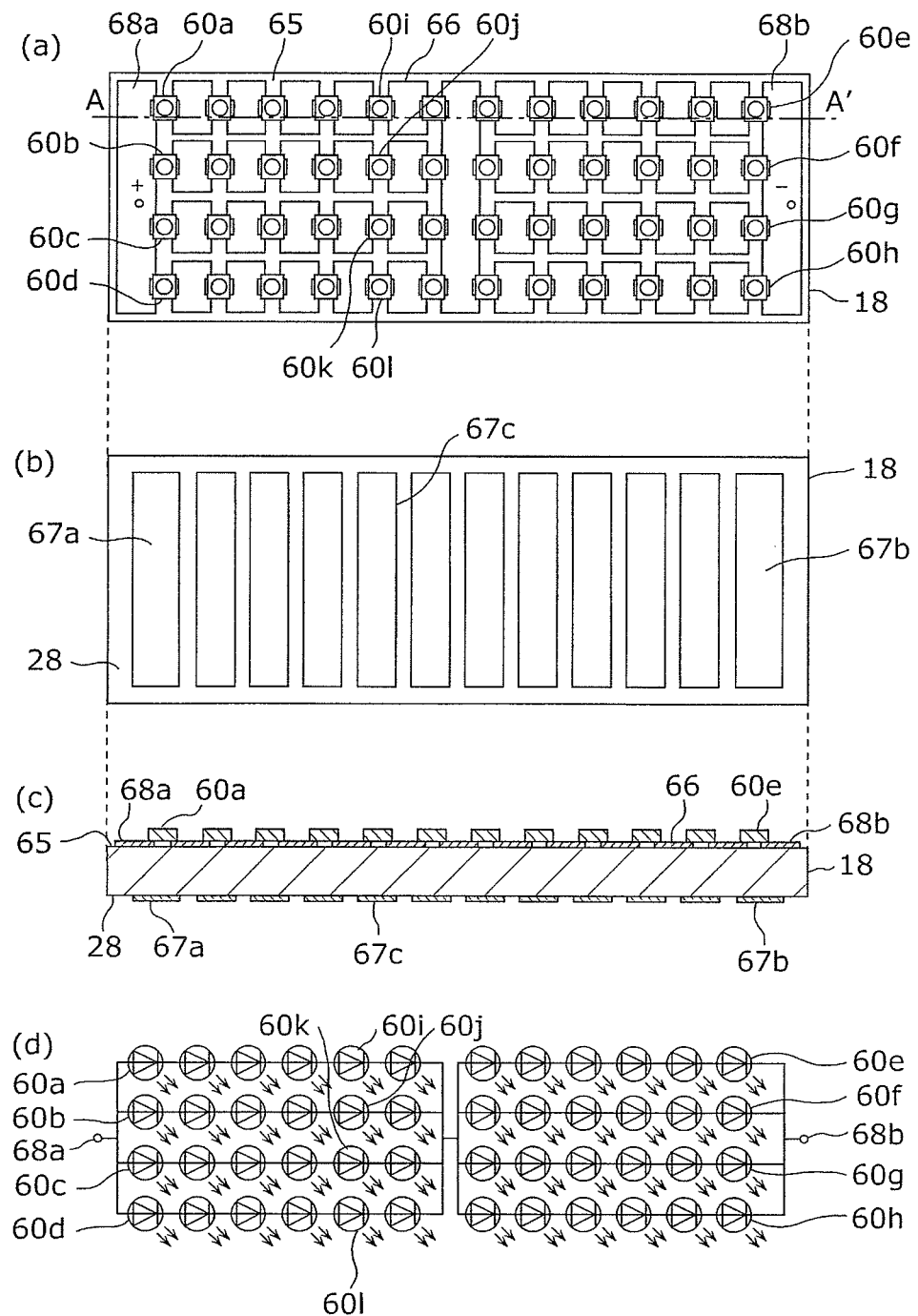
FIG. 3 illustrates a configuration of a light-emitting device according to the second modification of the first embodiment of the present invention.

FIG. 3 illustrates a configuration of a light-emitting device according to the present modification. It should be noted that FIG. 3 (a) is a top view of the light-emitting device (plan view of the top face of a board). FIG. 3 (b) is a bottom view of the light-emitting device (plan view of the undersurface of the board). Moreover, FIG. 3 (c) is a cross-sectional view of the light-emitting device (cross-sectional view taken along the line A-A' in FIG. 3 (a)). FIG. 3 (d) is a circuit diagram illustrating a circuitry of the light-emitting device.

This light-emitting device differs from the light-emitting device of the present embodiment in that not only one but two parallel connection units (parallel circuits) of the light-emitting elements are formed, and the two parallel connection units are connected in series. The following mainly describes differences between this light-emitting device and a light-emitting device according to the present embodiment.

This light-emitting device includes the board 18, the light-emitting elements 60a to 60l provided above the top face 65 of the board 18, the wiring patterns 66 and the terminals 68a and 68b, and the metal patterns 67a to 67c provided on the undersurface 28 of the board 18.

Six light-emitting elements are connected in series to form a series connection unit. Four such series connection units are connected in parallel to form a parallel connection unit. Two such parallel connection units are connected in series in the circuit. Each of the four series connection units that form this parallel connection unit includes light-emitting elements aligned in the longitudinal direction of the board 18 among the light-emitting elements. Moreover, two parallel connection units are aligned in the longitudinal direction of the board 18. The number of the wiring patterns 66 totals 41.

More specifically, the light-emitting elements 60a and 60i among the light-emitting elements are aligned in the longitudinal direction of the board 18 to form one series connection unit. Likewise, the light-emitting elements 60b and 60j among the light-emitting elements are aligned in the longitudinal direction of the board 18 to form another series connection unit. Moreover, the light-emitting elements 60c and 60k among the light-emitting elements are aligned in the longitudinal direction of the board 18 to form yet another series connection unit. The light-emitting elements 60d and 60l among the light-emitting elements are aligned in the longitudinal direction of the board 18 to form yet further another series connection unit. Moreover, these four series connection units are connected in parallel to form one parallel connection unit. This parallel connection unit is connected in series with the other parallel connection unit including a parallel connection unit of the light-emitting elements 60e, 60f, 60g, and 60h.

Thus, according to the light-emitting device of the present modification, it is possible to suppress current variation between parallel-connection paths, for a similar reason for the light-emitting device of the present embodiment. Moreover, a stress over the light-emitting elements and a soldered portion can be reduced. Furthermore, a lighting apparatus of a small and simple structure can be achieved.

Moreover, in the light-emitting device of the present modification, the parallel connection unit of the light-emitting elements 60a and 60b are connected in series with the parallel connection unit of the light-emitting elements 60e and 60f.

Moreover, the light-emitting device of the present modification includes the light-emitting elements 60i and 60j provided above the top face 65 of the board 18. The light-emitting element 60i is connected in series with the light-emitting element 60a, and is connected in parallel with the light-emitting element 60b. The light-emitting element 60j is connected in series with the light-emitting element 60b, and is connected in parallel with the light-emitting elements 60a and 60i. The light-emitting device includes a metal pattern 60c that is provided continuously under the light-emitting elements 60i and 60j, on the undersurface 28 of the board 18. Here, the metal pattern 60c is isolated from the metal patterns 67a and 67b.

Since the light-emitting device has a circuitry in which parallel connection units are connected in series, it is possible to reduce the number of light-emitting elements included in one series connection unit of a parallel connection unit, when compared to a circuitry having only one parallel connection unit. When poor conduction is caused in a predetermined light-emitting element in a series connection unit, a current stops flowing and poor light emission is caused in other light-emitting elements (light-emitting elements different from the predetermined light-emitting element). However, using the above circuitry having parallel connection units connected in series can reduce the number of such light-emitting elements.

Figure 4:
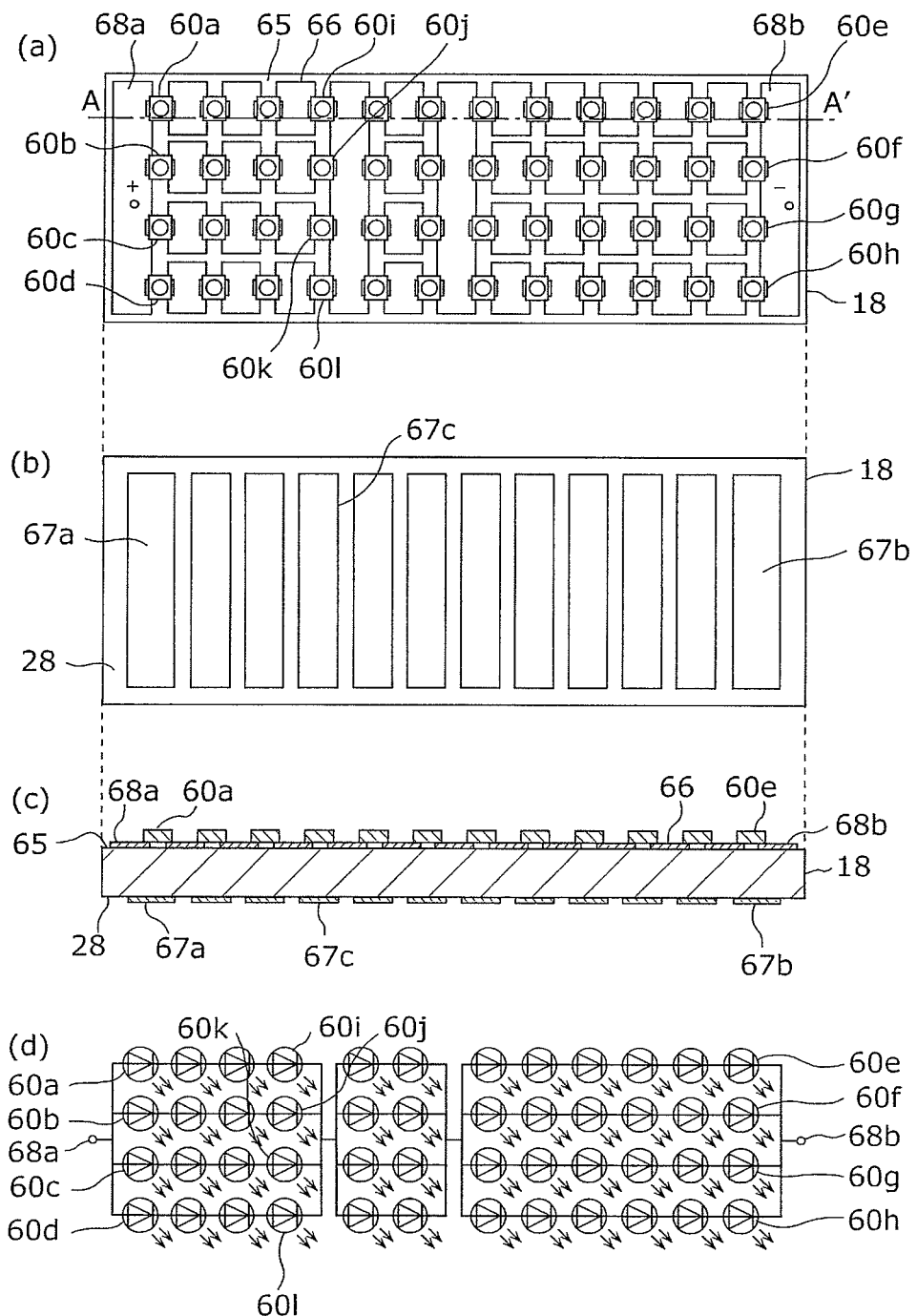
FIG. 4 illustrates a configuration of a light-emitting device according to the second modification of the first embodiment of the present invention.

It should be noted that in the present modification, two parallel connection units are connected in series. However, as shown in FIG. 4, three parallel connection units may be connected in series. In this case, the number of the wiring patterns 66 totals 38. Here, FIG. 4 illustrates a configuration of a light-emitting device according to the present modification. It should be noted that FIG. 4 (*a*) is a top view of the light-emitting device (plan view of the top face of a board). FIG. 4 (*b*) is a bottom view of the light-emitting device (plan view of the undersurface of the board). Moreover, FIG. 4 (*c*) is a cross-sectional view of the light-emitting device (cross-sectional view taken along the line A-A' in FIG. 4 (*a*)). FIG. 4 (*d*) is a circuit diagram illustrating a circuitry of the light-emitting device.

[Modification 3]

The following describes a light-emitting device according to the third modification of the present embodiment.

Figure 5:
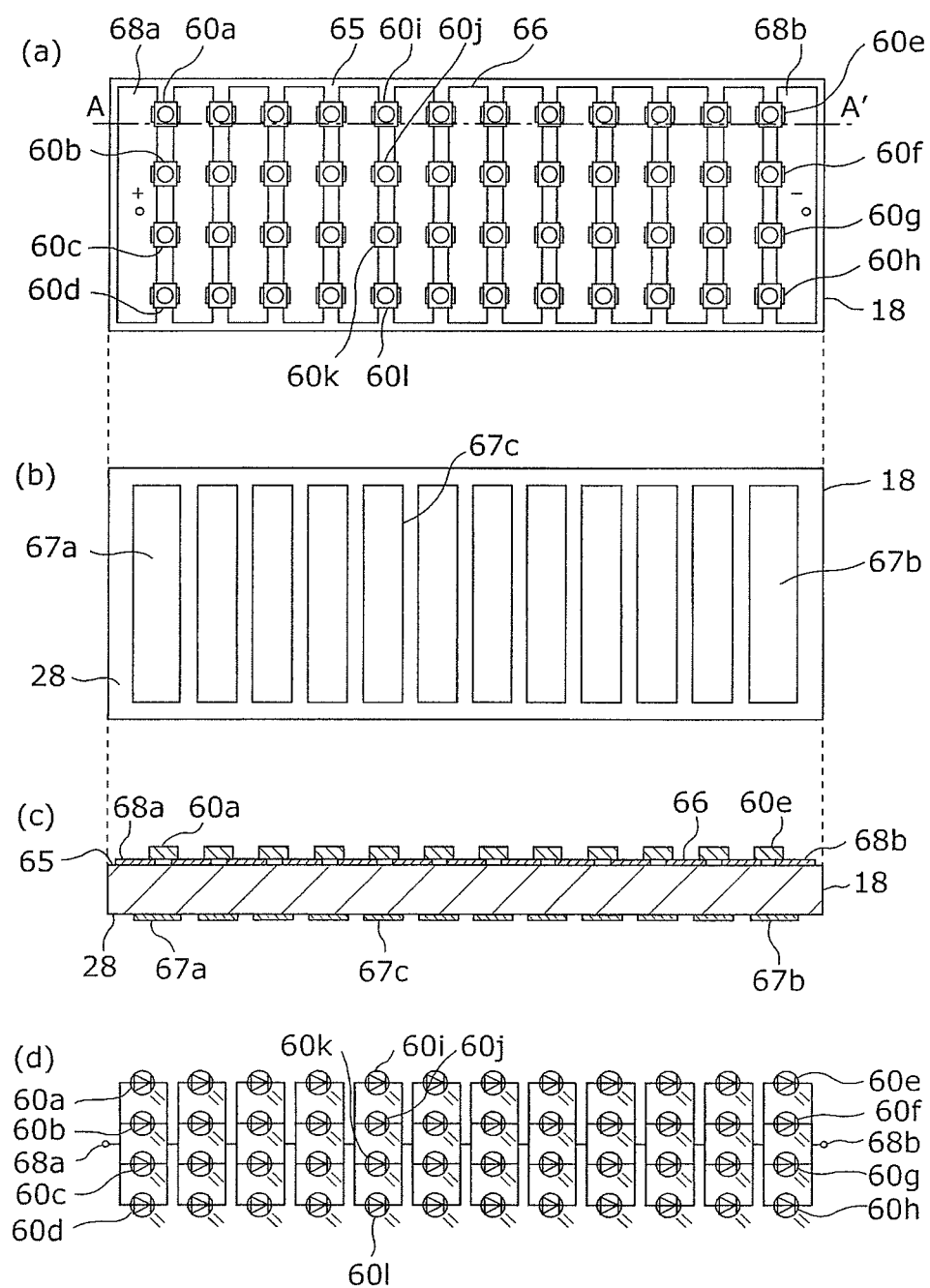
FIG. 5 illustrates a configuration of a light-emitting device according to the third modification of the first embodiment of the present invention.

Here, FIG. 5 illustrates a configuration of a light-emitting device according to the present modification. It should be noted that FIG. 5 (*a*) is a top view of the light-emitting device (plan view of the top face of a board). FIG. 5 (*b*) is a bottom view of the light-emitting device (plan view of the undersurface of the board). Moreover, FIG. 5 (*c*) is a cross-sectional view of the light-emitting device (cross-sectional view taken along the line A-A' in FIG. 5 (*a*)). FIG. 5 (*d*) is a circuit diagram illustrating a circuitry of the light-emitting device.

This light-emitting device differs from the light-emitting device of the present embodiment in that this light-emitting device includes not one but several parallel connection units of light-emitting elements, and each of the several parallel connection units does not include a series connection unit. The following mainly describes differences between this light-emitting device and the light-emitting device according to the present embodiment.

This light-emitting device includes the board 18, the light-emitting elements 60a to 60l provided above the top face 65 of the board 18, the wiring patterns 66 and the terminals 68a and 68b, and the metal patterns 67a to 67c provided on the undersurface 28 of the board 18.

Four light-emitting elements are aligned in the lateral direction of the board 18 to form a parallel connection unit. In the circuit, 12 such parallel connection units are connected in series. The 12 parallel connection units are aligned in the longitudinal direction of the board 18. The number of the wiring patterns 66 totals 11.

More specifically, the light-emitting elements 60a, 60b, 60c, and 60d among the light-emitting elements are aligned in the lateral direction of the board 18 to form one parallel connection unit. Likewise, the light-emitting elements 60e, 60f, 60g, and 60h among the light-emitting elements are aligned in the lateral direction of the board 18 to form one parallel connection unit. Likewise, the light-emitting elements 60i, 60j, 60k, and 60l among the light-emitting elements are aligned in the lateral direction of the board 18 to form one parallel connection unit. These parallel connection units are connected in series. Each of the metal patterns corresponds to one of the parallel connection units.

Thus, according to the light-emitting device of the present modification, it is possible to suppress current variation between parallel-connection paths, for a similar reason for the light-emitting device of the present embodiment. Moreover, a stress over the light-emitting elements and a soldered portion can be reduced. Furthermore, a lighting apparatus of a small and simple structure can be achieved.

Moreover, the light-emitting device according to the present modification includes the light-emitting elements 60i and 60j provided above the top face 65 of the board 18. The light-emitting elements 60i and 60j are interconnected in parallel and are connected in series with the parallel connection unit of the light-emitting elements 60a and 60b. The light-emitting device includes a metal pattern 67c that is provided continuously under the light-emitting elements 60*i* and 67*j*, on the undersurface 28 of the board 18. Here, the metal pattern 67*c* is isolated from the metal patterns 67*a* and 67*b*.

The light-emitting device has a circuitry in which each of the parallel connection units does not include a series connection unit. Therefore, when poor conduction is caused in a predetermined light-emitting element, it is possible to suppress poor light emission of another light-emitting element in which current stops flowing due to the poor conduction of the above light-emitting element.

Moreover, when the light-emitting device has a circuitry in which a parallel connection unit does not have a series connection unit, current variation can be absorbed between the light-emitting elements in the series connection unit. However, in a circuitry without a series connection unit, such adjustment can not be made. Therefore, it is highly beneficial to use the metal patterns 67*a* and 67*b* to suppress current variation in the light-emitting device according to the present modification.

Moreover, since the light-emitting device has a circuitry in which a parallel connection unit does not have a series connection unit, a single item test can be conducted on the light-emitting elements mounted above the board 18. In the single item test, the light-emitting elements are tested by causing them to emit light one by one.

[Modification 4]

The following describes a light-emitting device according to the fourth modification of the present embodiment.

Figure 6:
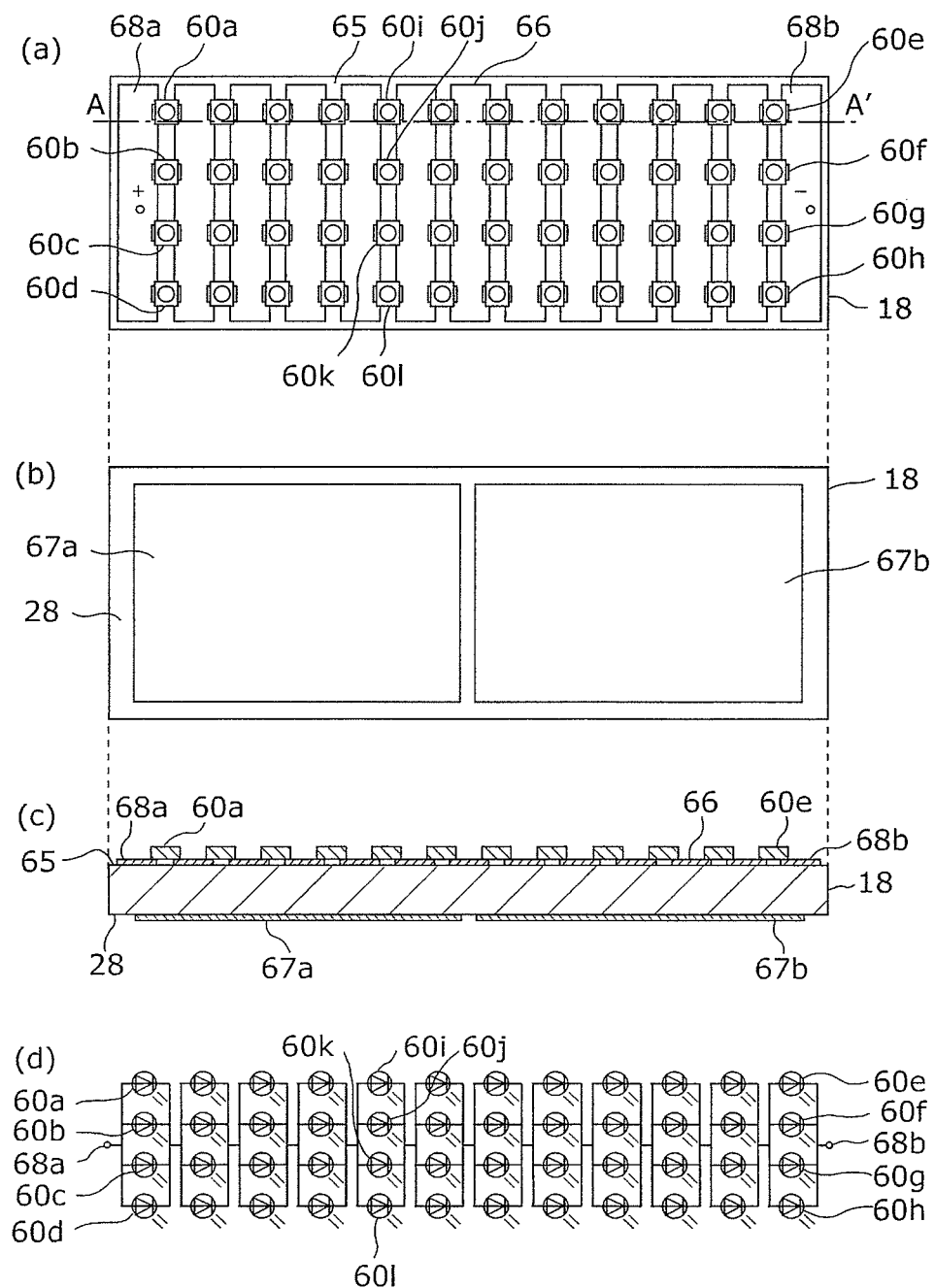
FIG. 6 illustrates a configuration of a light-emitting device according to the fourth modification of the first embodiment of the present invention.

FIG. 6 illustrates a configuration of a light-emitting device according to the present modification. It should be noted that FIG. 6 (*a*) is a top view of the light-emitting device (plan view of the top face of a board). FIG. 6 (*b*) is a bottom view of the light-emitting device (plan view of the undersurface of the board). Moreover, FIG. 6 (*c*) is a cross-sectional view of the light-emitting device (cross-sectional view taken along the line A-A' in FIG. 6 (*a*)). FIG. 6 (*d*) is a circuit diagram illustrating a circuitry of the light-emitting device.

This light-emitting device differs from the light-emitting device of the third modification of the present embodiment in that one metal pattern not only thermally connects light-emitting elements connected in parallel among the light-emitting elements, but also thermally connects parallel connection units connected in series among the light-emitting elements. The following mainly describes differences between this light-emitting device and the light-emitting device according to the third modification of the present embodiment.

This light-emitting device includes the board 18, the light-emitting elements 60*a* to 60*l* provided above the top face 65 of the board 18, the wiring patterns 66 and the terminals 68*a* and 68*b*, and the metal patterns 67*a* to 67*c* provided on the undersurface 28 of the board 18.

The metal patterns 67*a* and 67*b* are rectangular patterns that have four sides parallel to the longitudinal direction or lateral direction of the board 18. The metal patterns 67*a* and 67*b* are formed separately in the longitudinal direction of the board 18. In other words, one metal pattern is divided into two metal patterns in the longitudinal direction of the board 18, i.e., a direction in which warpage tends to occur to form the metal patterns 67*a* and 67*b*. Each of the metal patterns 67*a* and 67*b* corresponds to a whole area below one column of light-emitting elements and an adjacent column of light-emitting elements which are aligned in the longitudinal direction. The one column includes light-emitting elements connected in parallel and aligned in the lateral direction of the board 18 among the light-emitting elements. The adjacent column includes light-emitting elements connected in parallel and aligned in the lateral direction of the board 18 among the light-emitting elements. Each of the metal patterns 67*a* and 67*b* is thermally connected to light-emitting elements above the metal pattern. Therefore, the metal patterns are different from the metal patterns of the present embodiment in that the metal patterns of the present modification are also formed under the wiring patterns 66. Moreover, only two metal patterns are formed and the metal pattern 67*c* is not formed.

More specifically, the metal pattern 67*a* among the metal patterns corresponds to a whole area below the light-emitting elements 60*a*, 60*b*, 60*c*, and 60*d* and the light-emitting elements 60*i*, 60*j*, 60*k*, and 60*l*. The metal pattern 67*a* is thermally connected to the light-emitting elements 60*a*, 60*b*, 60*c*, and 60*d* and the light-emitting elements 60*i*, 60*j*, 60*k*, and 60*l*. On the other hand, the metal pattern 67*b* among the metal patterns corresponds to a whole area below the light-emitting elements 60*e*, 60*f*, 60*g*, and 60*h* connected in parallel. The metal pattern 67*b* is thermally connected to the light-emitting elements 60*e*, 60*f*, 60*g*, and 60*h*.

Thus, according to the light-emitting device of the present modification, it is possible to suppress current variation between parallel-connection paths, for a similar reason for the light-emitting device of the present embodiment. Moreover, a stress over the light-emitting elements and a soldered portion can be reduced. Furthermore, a lighting apparatus of a small and simple structure can be achieved.

Moreover, the light-emitting device according to the present modification includes the light-emitting elements 60*i* and 60*j* provided above the top face 65 of the board 18. The light-emitting elements 60*i* and 60*j* are interconnected in parallel and are connected in series with the parallel connection unit of the light-emitting elements 60*a* and 60*b*. The metal pattern 67*a* is provided continuously under the light-emitting elements 60*a*, 60*b*, 60*i*, and 60*j*.

Thus, the metal pattern 67*a* not only thermally connects the parallel connection unit of the light-emitting elements 60*a* and 60*b*, but also thermally connects the parallel connection unit of the light-emitting elements 60*i* and 60*j*. Therefore, it is possible to substantially equalize temperature rises between the parallel connection units connected in series.

It should be noted that in the light-emitting device according to the present modification, the metal patterns 67*a* and 67*b* are rectangular patterns. However, the metal patterns 67*a* and 67*b* may be patterns of shapes such as a trapezoid, a polygon, and a circle.

[Modification 5]

The following describes a light-emitting device according to the fifth modification of the present embodiment.

Figure 7:
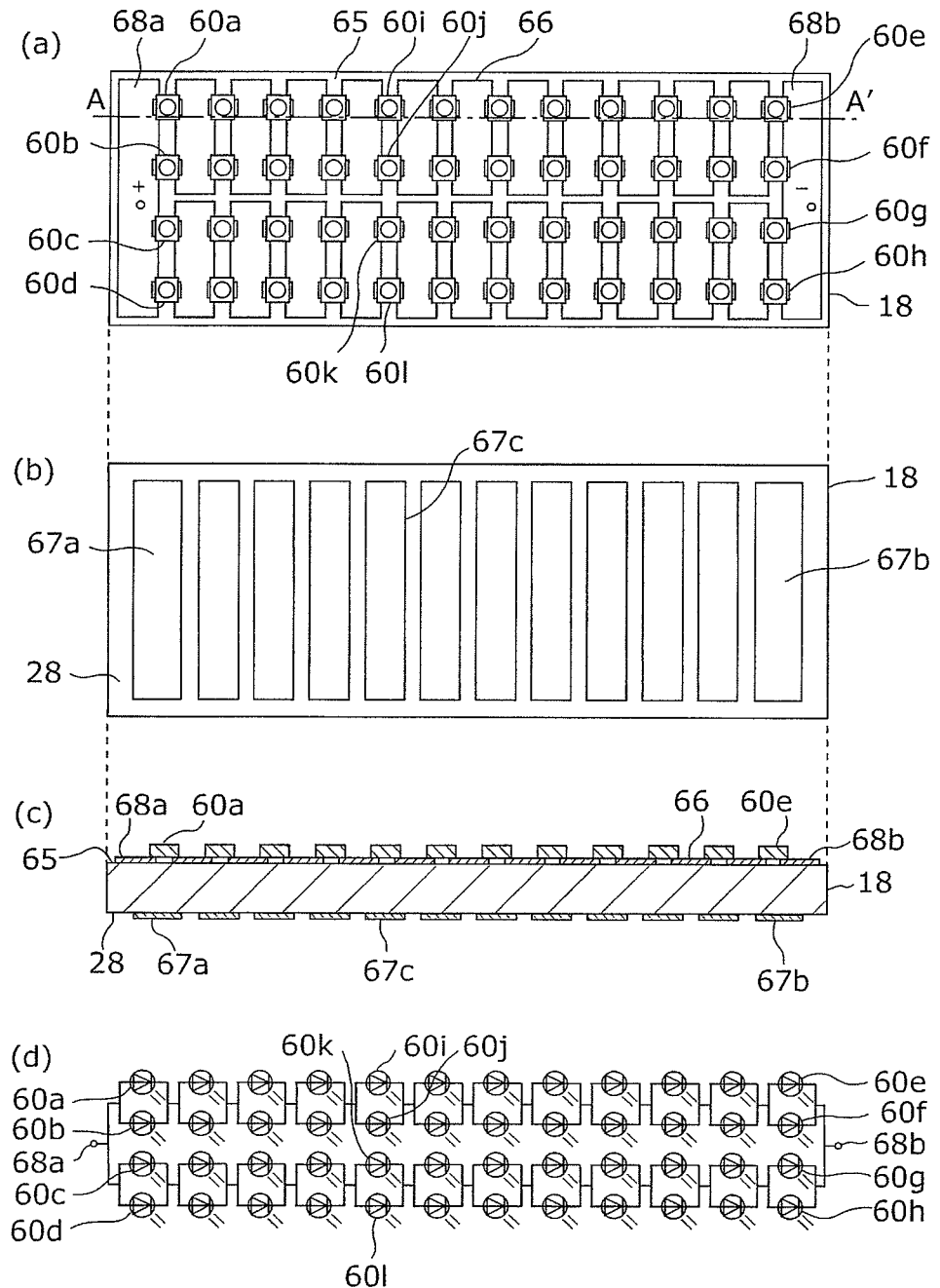
FIG. 7 illustrates a configuration of a light-emitting device according to the fifth modification of the first embodiment of the present invention.

FIG. 7 illustrates a configuration of a light-emitting device according to the present modification. It should be noted that FIG. 7 (*a*) is a top view of the light-emitting device (plan view of the top face of a board). FIG. 7 (*b*) is a bottom view of the light-emitting device (plan view of the undersurface of the board). Moreover, FIG. 7 (*c*) is a cross-sectional view of the light-emitting device (cross-sectional view taken along the line A-A' in FIG. 7 (*a*)). FIG. 7 (*d*) is a circuit diagram illustrating a circuitry of the light-emitting device.

This light-emitting device differs from the light-emitting device of the present embodiment in that this light-emitting device includes not one but several parallel connection units of light-emitting elements, and each of the several parallel connection units does not include a series connection unit. The following mainly describes differences between this light-emitting device and the light-emitting device according to the present embodiment.

This light-emitting device includes the board 18, the light-emitting elements 60*a* to 60*l* provided above the top face 65 of the board 18, the wiring patterns 66 and the terminals 68a and 68b, and the metal patterns 67a to 67c provided on the undersurface 28 of the board 18.

Two light-emitting elements are connected in parallel to form a parallel connection unit. Twelve such parallel connection units are connected to form a series connection unit. In the circuit, two such series connection units are connected in parallel. The 12 parallel connection units connected in series are aligned in the longitudinal direction of the board 18. The series connection units connected in parallel are aligned in the lateral direction of the board 18. The number of the wiring patterns 66 totals 22.

More specifically, the light-emitting elements 60a and 60b among the light-emitting elements are aligned in the lateral direction of the board 18 to form one parallel connection unit. Likewise, the light-emitting elements 60e and 60f among the light-emitting elements are aligned in the lateral direction of the board 18 to form one parallel connection unit. Likewise, the light-emitting elements 60i and 60j among the light-emitting elements are aligned in the lateral direction of the board 18 to form one parallel connection unit. These parallel connection units are connected in series.

Moreover, the light-emitting elements 60c and 60d among the light-emitting elements are aligned in the lateral direction of the board 18 to form one parallel connection unit. Likewise, the light-emitting elements 60g and 60h among the light-emitting elements are aligned in the lateral direction of the board 18 to form one parallel connection unit. Likewise, the light-emitting elements 60k and 60l among the light-emitting elements are aligned in the lateral direction of the board 18 to form one parallel connection unit. These parallel connection units are connected in series.

Each of the metal patterns 67a to 67c corresponds to a whole area under one column of light-emitting elements (parallel connection unit) included in one series connection and an adjacent column of light-emitting elements (parallel connection unit) included in another series connection. The one column includes light-emitting elements connected in parallel and aligned in the lateral direction of the board 18 among the light-emitting elements. The adjacent column includes light-emitting elements connected in parallel and aligned in the lateral direction of the board 18 among the light-emitting elements. Each of the metal patterns 67a and 67b is thermally connected to the light-emitting elements above the metal pattern.

More specifically, the metal pattern 67a among the metal patterns corresponds to a whole area under the light-emitting elements 60a, 60b, 60c, and 60d. Thus, the metal pattern 67a is thermally connected to the light-emitting elements 60a, 60b, 60c, and 60d. Moreover, the metal pattern 67b among the metal patterns corresponds to a whole area under the light-emitting elements 60e, 60f, 60g, and 60h connected in parallel. The metal pattern 67b is thermally connected to the light-emitting elements 60e, 60f, 60g, and 60h. Moreover, the metal pattern 67c among the metal patterns corresponds to a whole area under the light-emitting elements 60i, 60j, 60k, and 60l. The metal pattern 67c is thermally connected to the light-emitting elements 60i, 60j, 60k, and 60l.

Thus, according to the light-emitting device of the present modification, it is possible to suppress current variation between parallel-connection paths, for a similar reason for the light-emitting device of the present embodiment. Moreover, a stress over the light-emitting elements and a soldered portion can be reduced. Furthermore, a lighting apparatus of a small and simple structure can be achieved.

Moreover, the light-emitting device of the present modification includes the parallel connection unit of the light-emitting elements 60c and 60d in addition to the parallel connection unit of the light-emitting elements 60a and 60b. These parallel connection units are connected in parallel. The metal pattern 67a is provided continuously under these two parallel connection units.

The light-emitting device has a circuitry in which each of the parallel connection units does not include a series connection unit. Therefore, when poor conduction is caused in a predetermined light-emitting element, it is possible to suppress poor light emission of another light-emitting element in which current stops flowing due to the poor conduction of the above light-emitting element.

[Modification 6]

The following describes a light-emitting device according to the sixth modification of the present embodiment.

Figure 8:
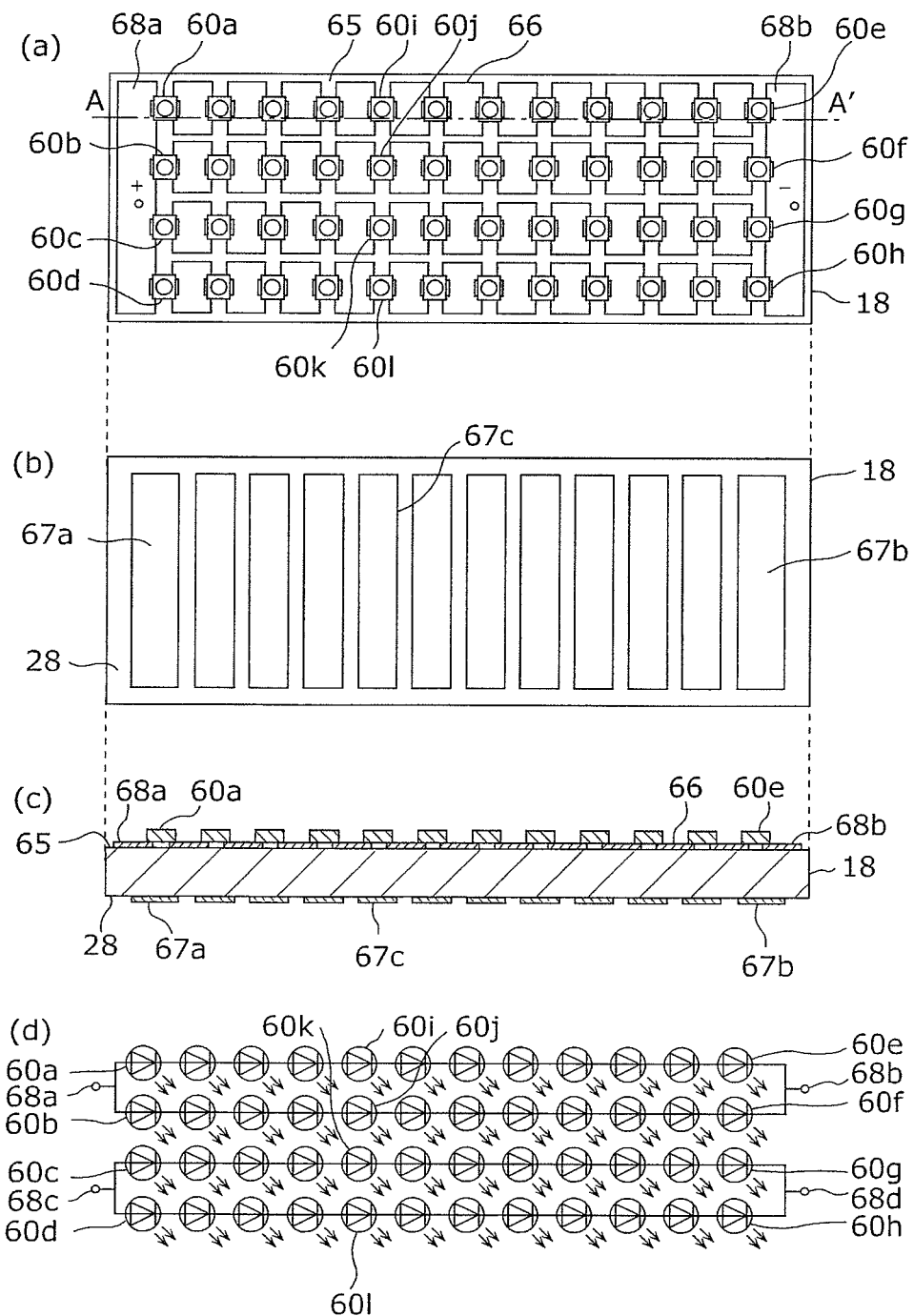
FIG. 8 illustrates a configuration of a light-emitting device according to the sixth modification of the first embodiment of the present invention.

FIG. 8 illustrates a configuration of a light-emitting device according to the present modification. It should be noted that FIG. 8 (a) is a top view of the light-emitting device (plan view of the top face of a board). FIG. 8 (b) is a bottom view of the light-emitting device (plan view of the undersurface of the board). Moreover, FIG. 8 (c) is a cross-sectional view of the light-emitting device (cross-sectional view taken along the line A-A' in FIG. 8 (a)). FIG. 8 (d) is a circuit diagram illustrating a circuitry of the light-emitting device.

This light-emitting device differs from the light-emitting device of the present embodiment in the following point. In the light-emitting device of the present embodiment, four series connection units are connected in parallel to form one parallel connection unit. On the other hand, in this light-emitting device, two series connection units are connected in parallel to form one parallel connection unit, and the remaining two series connection units are connected in parallel to form another parallel connection unit. Here, a pair of terminals between which one parallel connection unit is provided is different from a pair of terminals between which the other parallel connection unit is provided. The following mainly describes differences between this light-emitting device and the light-emitting device according to the present embodiment.

This light-emitting device includes the board 18, the light-emitting elements 60a to 60l provided above the top face 65 of the board 18, the wiring patterns 66 and the terminals 68a to 68d, and the metal patterns 67a to 67c provided on the undersurface 28 of the board 18.

Twelve light-emitting elements are connected in series to form a series connection unit. Two such series connection units are connected in parallel to form a parallel connection unit, and the parallel connection unit is provided between the terminals 68a and 68b in one circuit. Twelve light-emitting elements are connected in series to form another series connection unit. Two such series connection units are connected in parallel to form a parallel connection unit, and the parallel connection unit is provided between the terminals 68c and 68d in the other circuit. Each of the four series connection units includes light-emitting elements aligned in the longitudinal direction of the board 18 among the light-emitting elements. Four series connection units are aligned in the lateral direction of the board 18.

More specifically, the light-emitting elements 60a, 60i and 60e among the light-emitting elements are aligned in the longitudinal direction of the board 18 to form one series connection unit. Likewise, the light-emitting elements 60b, 60j, and 60f among the light-emitting elements are aligned in the longitudinal direction of the board 18 to form another series connection unit. These two series connection units are connected in parallel between the terminals 68a and 68b to form one parallel connection unit.

Moreover, the light-emitting elements 60c, 60k, and 60g among the light-emitting elements are aligned in the longitudinal direction of the board 18 to form one series connection unit. Likewise, the light-emitting elements 60d, 60l, and 60h among the light-emitting elements are aligned in the longitudinal direction of the board 18 to form another series connection unit. These two series connection units are connected in parallel between the terminals 68c and 68d to form one parallel connection unit.

The terminals 68a to 68d are wiring patterns provided on separate sides in the longitudinal direction of the board 18, and power receiving units that receive direct-current power from outside and supply the direct-current power to the light-emitting elements. The surfaces of the terminals 68a to 68d are exposed. The terminals 68a to 68d are electrically connected to light-emitting elements via the wiring patterns 66. When the direct-current voltage received by the terminals 68a to 68d is supplied to the light-emitting elements, the light-emitting elements emit desired light.

Each of the metal patterns corresponds to a whole area under one column of light-emitting elements (one parallel connection unit) and an adjacent column of light-emitting elements (one parallel connection unit). The one column includes light-emitting elements connected in parallel and aligned in the lateral direction of the board 18 among the light-emitting elements. The adjacent column includes light-emitting elements connected in parallel and aligned in the lateral direction of the board 18 among the light-emitting elements. Each of the metal patterns is thermally connected to the light-emitting elements above the metal pattern. Here, a pair of terminals between which one parallel connection unit is provided is different from a pair of terminals between which the other parallel connection unit is provided.

More specifically, the metal pattern 67a among the metal patterns corresponds to a whole area under the light-emitting elements 60a, 60b, 60c, and 60d. Thus, the metal pattern 67a is thermally connected to the light-emitting elements 60a, 60b, 60c, and 60d. Moreover, the metal pattern 67b among the metal patterns corresponds to a whole area under the light-emitting elements 60e, 60f, 60g, and 60h connected in parallel. Thus, the metal pattern 67b is thermally connected to the light-emitting elements 60e, 60f, 60g, and 60h. Moreover, the metal pattern 67c among the metal patterns corresponds to a whole area under the light-emitting elements 60i, 60j, 60k, and 60l. Thus, the metal pattern 67c is thermally connected to the light-emitting elements 60i, 60j, 60k, and 60l.

Thus, according to the light-emitting device of the present modification, it is possible to suppress current variation between parallel-connection paths, for a similar reason for the light-emitting device of the present embodiment. Moreover, a stress over the light-emitting elements and a soldered portion can be reduced. Furthermore, a lighting apparatus of a small and simple structure can be achieved.

Moreover, the light-emitting device of the present modification includes the parallel connection unit of the light-emitting elements 60c and 60d in addition to the parallel connection unit of the light-emitting elements 60a and 60b. One parallel connection unit is provided between the terminals 68a and 68b while the other parallel connection unit is provided between the terminals 68c and 68d. The metal pattern 67a is provided continuously under these two parallel connection units.

Thus, the light-emitting device has a circuitry in which a pair of terminals between which one parallel connection unit is provided is different from another pair of terminals between which the other parallel connection unit is provided. Therefore, even when poor conduction is caused in a predetermined light-emitting element provided between one of the two pairs of terminals, poor conduction is not caused in a light-emitting element between the other pair of terminals. Therefore, a light-emitting device can be realized in which even when the predetermined light-emitting element becomes defective, other light-emitting elements tend not to be affected by the effect.

[Modification 7]

The following describes a light-emitting device according to the seventh modification of the present embodiment.

Figure 9:
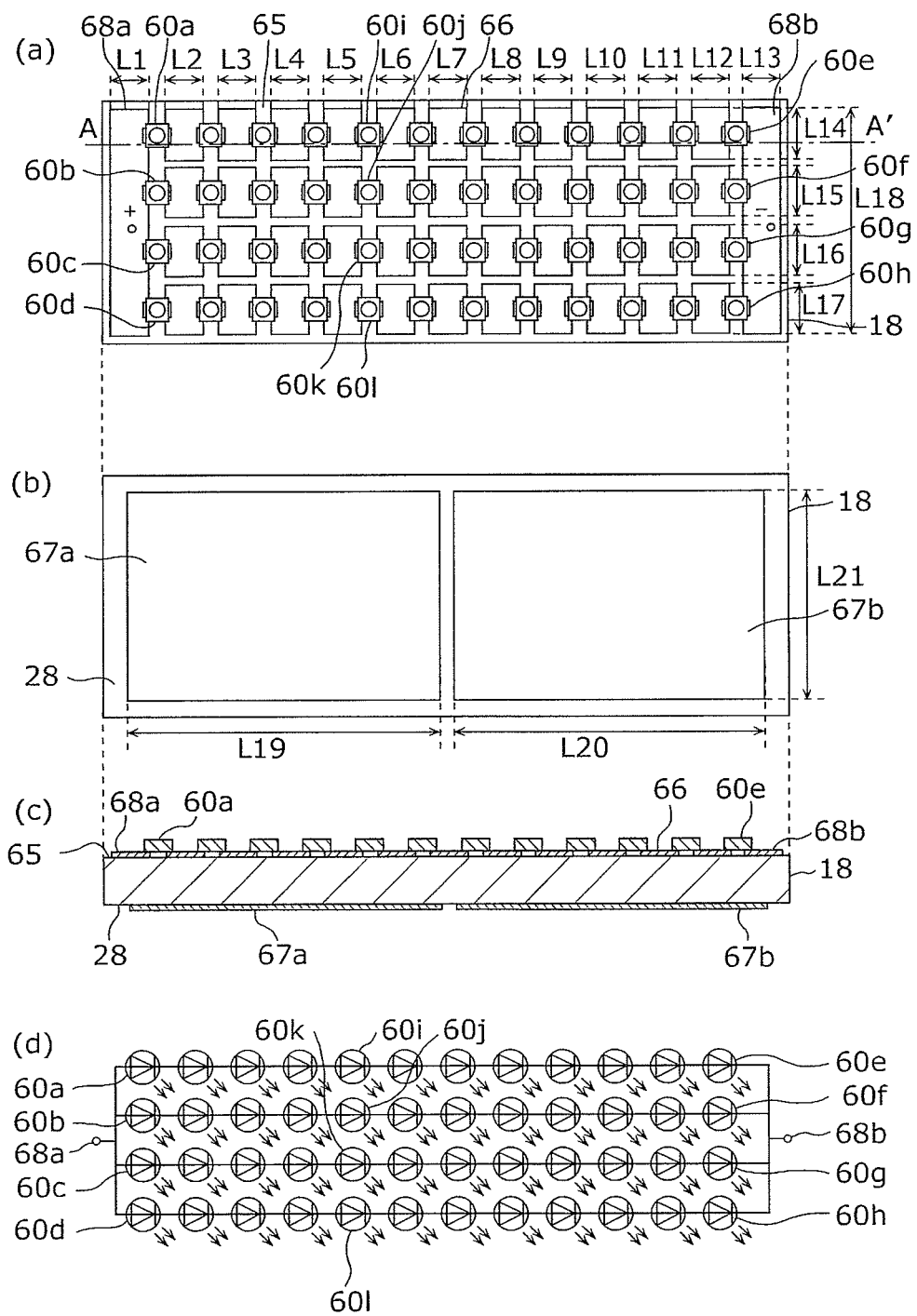
FIG. 9 illustrates a configuration of a light-emitting device according to the seventh modification of the first embodiment of the present invention.

FIG. 9 illustrates a configuration of a light-emitting device according to the present modification. It should be noted that FIG. 9 (a) is a top view of the light-emitting device (plan view of the top face of a board). FIG. 9 (b) is a bottom view of the light-emitting device (plan view of the undersurface of the board). Moreover, FIG. 9 (c) is a cross-sectional view of the light-emitting device (cross-sectional view taken along the line A-A' in FIG. 9 (a)). FIG. 9 (d) is a circuit diagram illustrating a circuitry of the light-emitting device.

This light-emitting device differs from the light-emitting device of the first modification of the present embodiment in that the total area S0 of the wiring patterns 66 and the terminals 68a and 68b on the top face 65 of the board 18 is substantially equal to the total area S1 of the metal patterns on the undersurface 28 of the board 18. The following mainly describes differences between this light-emitting device and the light-emitting device according to the first modification of the present embodiment.

This light-emitting device includes the board 18, the light-emitting elements 60a to 60l provided above the top face 65 of the board 18, the wiring patterns 66 and the terminals 68a and 68b, and the metal patterns 67a and 67b provided on the undersurface 28 of the board 18.

The widths of the wiring patterns 66 aligned in the longitudinal direction of the board 18 are L2, L3, L4, L5, L6, L7, L8, L9, L10, L11, and L12, respectively. The widths of the terminals 68a and 68b are L1 and L13, respectively. Moreover, the lengths of the wiring patterns 66 in the lateral direction of the board 18 (the wiring patterns 66 aligned in the lateral direction of the board 18) are L14, L15, L16, and L17, respectively. The lengths of the terminals 68a and 68b are both L18. The widths of the metal patterns 67a and 67b in the longitudinal direction of the board 18 are L19 and L20, respectively. The widths of the metal patterns 67a and 67b in the lateral direction of the board 18 are both L21. Here, the following expression holds:

$$S0=(L1+L13) \times L18+(L2+L3+L4+L5+L6+L7+L8+L9+L10+L11+L12) \times (L14+L15+L16+L17)=(L19+L20) \times L21=S1.$$

The thickness of the wiring patterns 66 and terminals 68a and 68b is substantially equal to the thickness of the wiring patterns 67a and 67b. The thickness can be set to 35 μm, for example.

Thus, according to the light-emitting device of the present modification, it is possible to suppress current variation between parallel-connection paths, for a similar reason for the light-emitting device of the present embodiment. Moreover, a stress over the light-emitting elements and a soldered portion can be reduced. Furthermore, a lighting apparatus of a small and simple structure can be achieved.

Moreover, according to a light-emitting device of the present modification, the total area S0 of metal patterns on the top face 65 of the board 18 including the wiring patterns 66 and the terminals 68a and 68b is substantially equal to the total area S1 of metal patterns on the undersurface 28 of the board 18 including the metal patterns 67a and 67b.

Moreover, the thickness of a metal pattern on the top face 65 of the board 18 including the wiring pattern 66 and the terminals 68a and 68b is substantially equal to the thickness of a metal pattern on the undersurface 28 of the board 18 including the metal patterns 67a and 67b.

As a result, although application of heat when the light-emitting elements 60a to 60l are mounted above the board 18 causes thermal expansion along with temperature rise in the board 18, the thermal expansion on the top face 65 and the undersurface 28 of the board 18 can be equalized. Therefore, the occurrence of warpage of the board 18 can be controlled.

Embodiment 2

Figure 10:
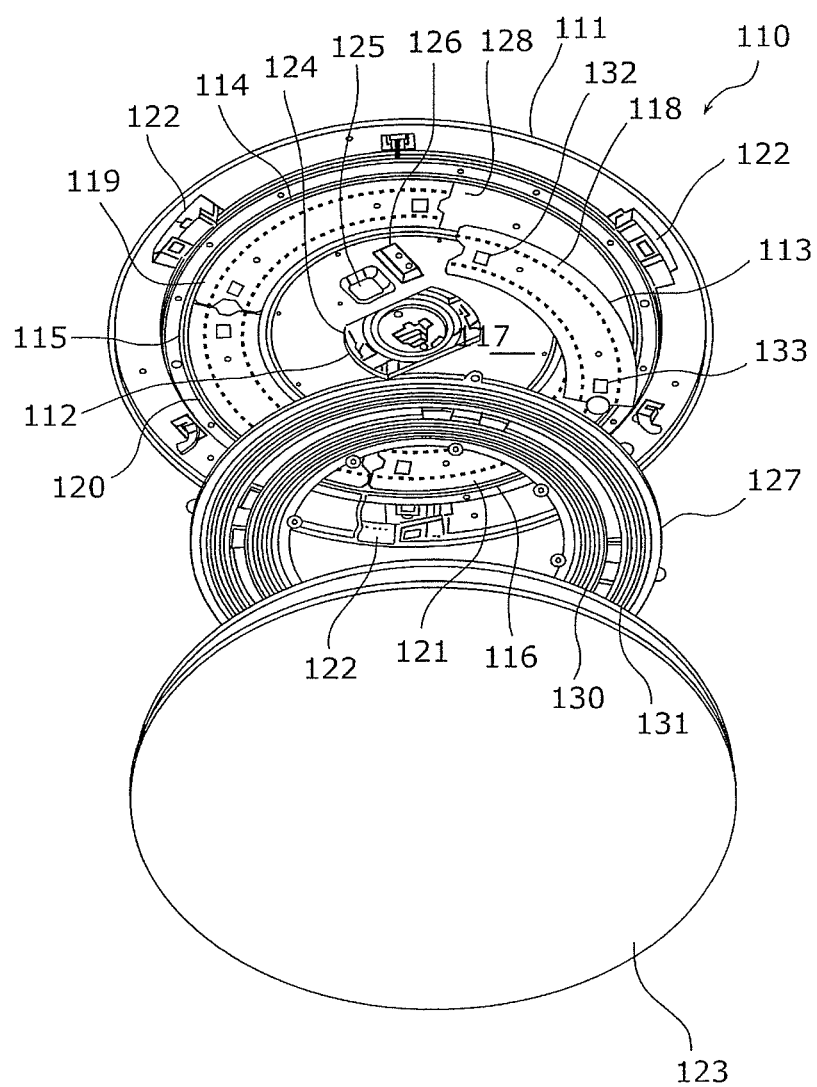
FIG. 10 is an external perspective view of a ceiling light as seen from obliquely below according to the second embodiment of the present invention.
Figure 11:
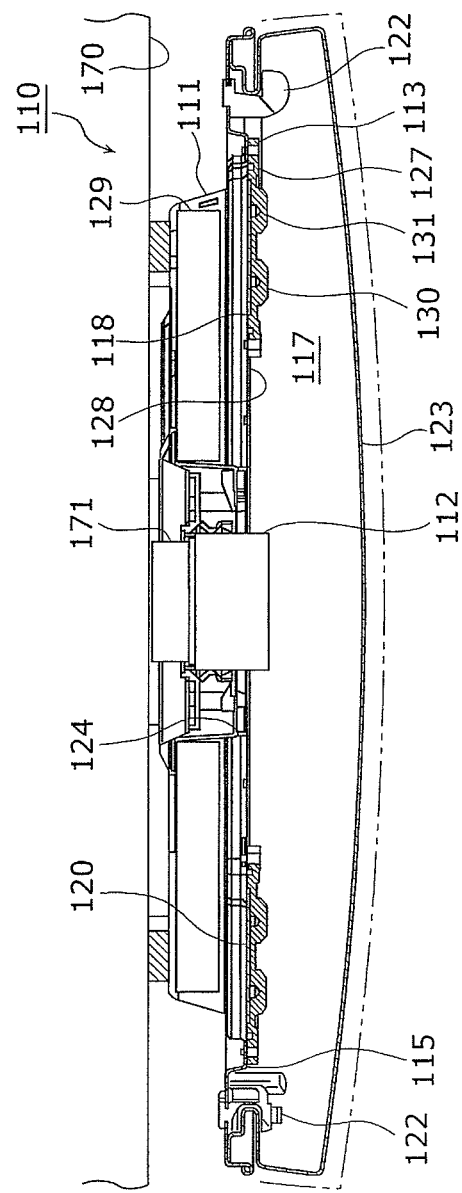
FIG. 11 is a vertical sectional view of a ceiling light according to the second embodiment of the present invention.
Figure 12:
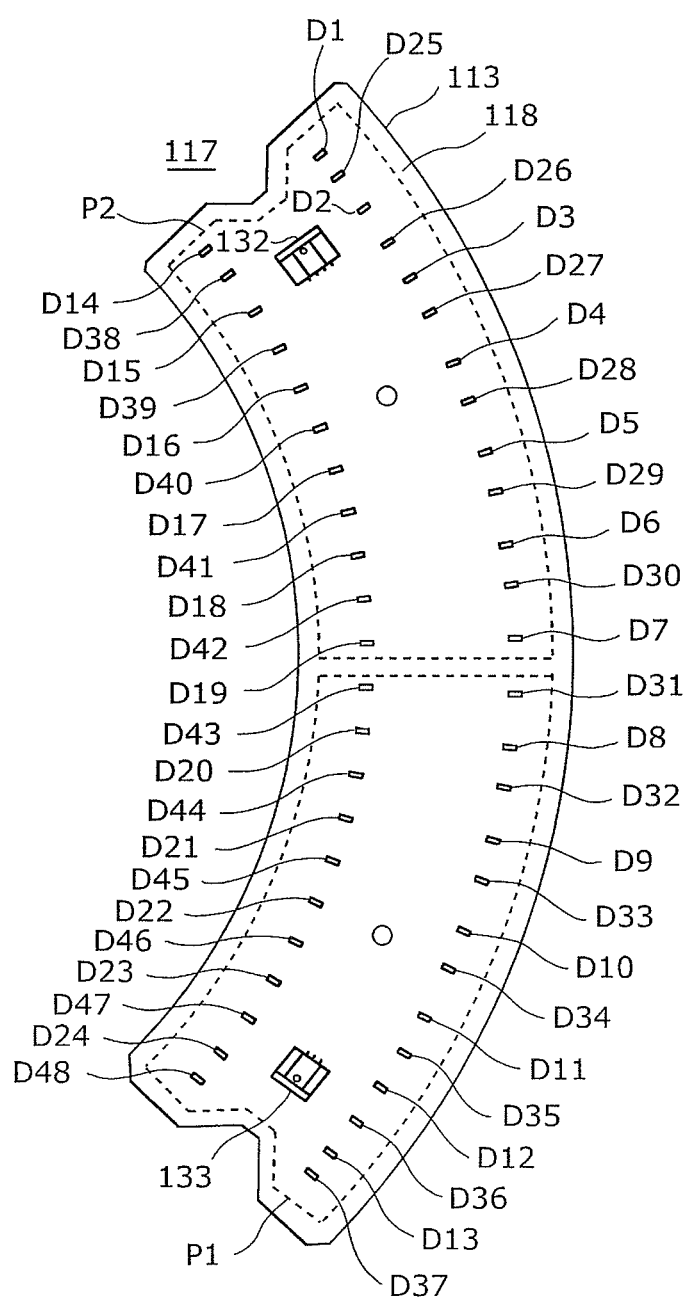
FIG. 12 is a plan view of the top face of the board of the first light-emitting unit in a ceiling light according to the second embodiment of the present invention.
Figure 13:
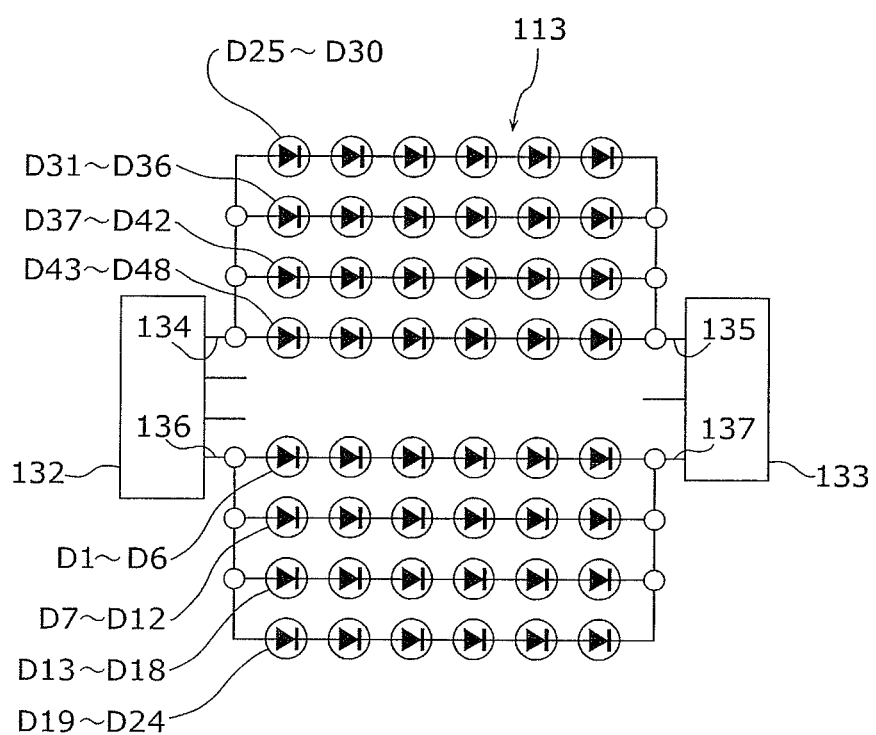
FIG. 13 is a circuit diagram illustrating a circuitry of the first light-emitting unit of a ceiling light according to the second embodiment of the present invention.
Figure 14:
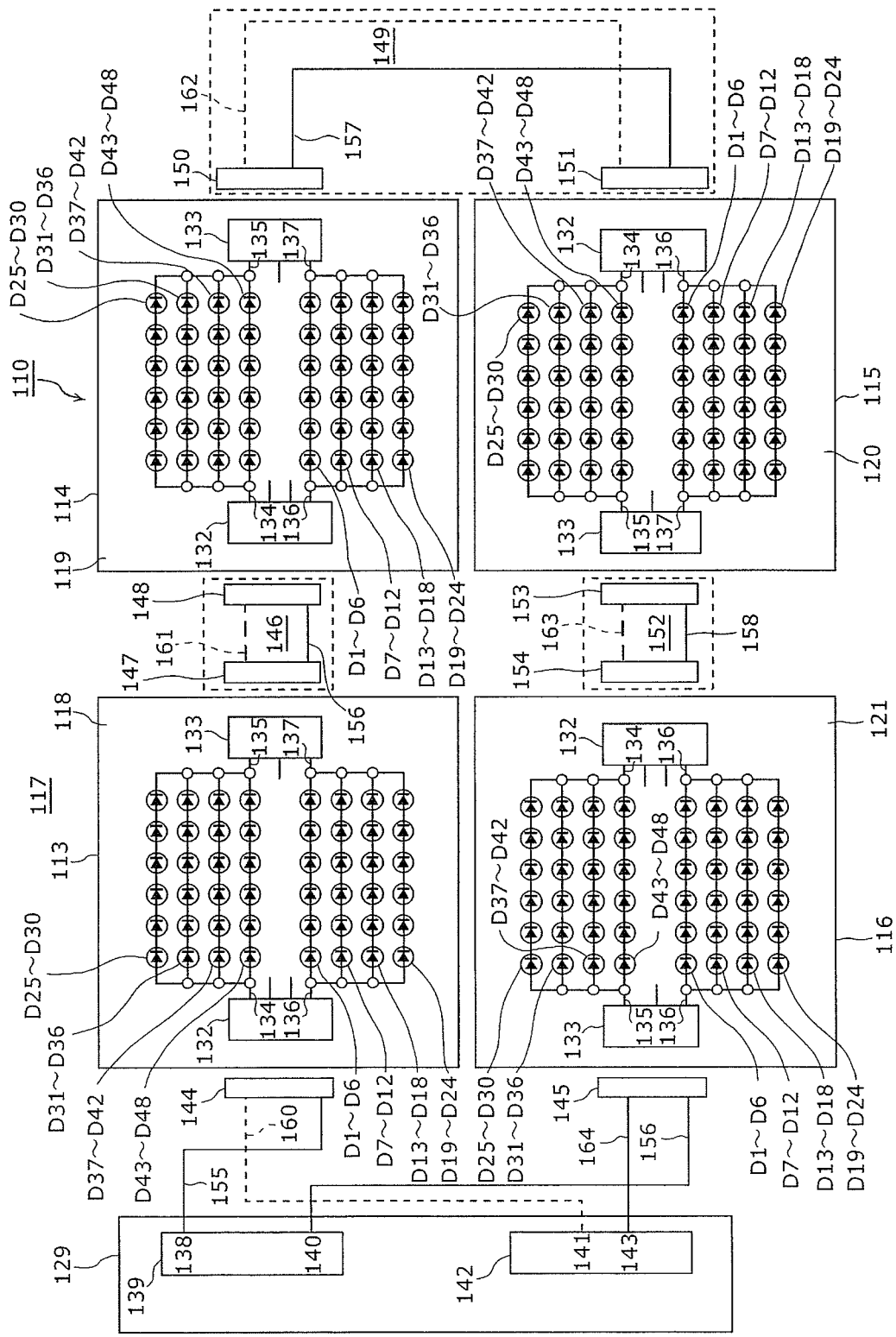
FIG. 14 is a circuit diagram illustrating a circuitry of a light-emitting part of a ceiling light according to the second embodiment of the present invention.

FIG. 10 is an external perspective view of a ceiling light as seen from obliquely below according to the second embodiment of the present invention. FIG. 11 is a vertical sectional view of the ceiling light. FIG. 12 is a plan view of the top face of a board of the first light-emitting unit in the ceiling light. FIG. 13 is a circuit diagram illustrating a circuitry of the first light-emitting unit of the ceiling light. FIG. 14 is a circuit diagram illustrating a circuitry of the light-emitting part of the ceiling light.

This ceiling light 110 is an example of a lighting apparatus (lighting system) having a light-emitting device according to the first embodiment. The ceiling light 110 includes a body 111 and an attaching portion 112 that is provided at the center of the body 111. The attaching portion 112 is used to attach the body 111 to a hook ceiling 171 installed in a ceiling 170 (cf. FIG. 11).

The ceiling light 110 includes, on the undersurface of the body 111, a light-emitting part 117 including a first light-emitting unit 113, a second light-emitting unit 114, a third light-emitting unit 115, and a fourth light-emitting unit 116. It should be noted that each of the first light-emitting unit 113, second light-emitting unit 114, the third light-emitting unit 115 and the fourth light-emitting unit 116 is an example of the light-emitting device according to the first embodiment.

The first light-emitting unit 113 has a first board 118. The second light-emitting unit 114 has a second board 119. The third light-emitting unit 115 has a third board 120. The fourth light-emitting unit 116 has a fourth board 121. The circumference of the board according to the first embodiment is, for example, divided into four parts at the periphery of the center of the body 111 to form four fan-shaped parts, that is, the first board 118, the second board 119, the third board 120, and the fourth board 121. The four fan-shaped parts have a thickness of 1.0 mm.

The ceiling light 110, for example, includes an opaque white cover 123 made of resin. The cover 123 is rotationally fixed to a cover engagement portion 122 provided at the periphery of the body 111 so as to cover the first light-emitting unit 113, the second light-emitting unit 114, the third light-emitting unit 115, and the fourth light-emitting unit 116.

The ceiling light 110 includes a hole 124 for operation of the attaching portion 112 at the center of the body 111 and a remote control receiver 125 having a light-receiving element (not shown in the figure) that receive a remote control signal. Here, the remote control receiver is near the hole 124. The ceiling light 110 has, near this hole 124, a channel setting portion 126 for setting the models of a remote control transmitter not shown in the figure.

The ceiling light 110 includes, at the periphery of the body 111, a ring-shaped lens 127 that is screwed on the body 111 so as to cover the first light-emitting unit 113, the second light-emitting unit 114, the third light-emitting unit 115, and the fourth light-emitting unit 116. This lens 127 is a wide-angle lens that distributes light components to the center of the cover 123.

As shown in FIG. 11, the body 111 has a disc-shaped body and is made of a material such as a thin die-cast material. The side facing a floor of the body 111 serves as a reflection surface. In addition, the body 111 has a board attaching surface 128, and contains a power source unit 129 above the attaching surface 128.

The power source unit 129 is electrically connected to an external power supply circuit (not shown in the figure), the first light-emitting unit 113, the second light-emitting unit 114, the third light-emitting unit 115, and the fourth light-emitting unit 116. The power source unit 129 converts commercial power supply of the external power supply circuit into direct-current power supply, and supplies it to the first light-emitting unit 113, the second light-emitting unit 114, the third light-emitting unit 115, and the fourth light-emitting unit 116.

The attaching portion 112 is mechanically and electrically connected to the hook ceiling 171 by attaching the attaching portion 112 to the hook ceiling 171 installed in the ceiling 170.

The lens 127 includes an inner-circumference side lens unit 130 and an outer-circumference-side lens unit 131. The inner-circumference-side lens unit 130 covers the inner circumference side of the first light-emitting unit 113, the second light-emitting unit 114, the third light-emitting unit 115, and the fourth light-emitting unit 116. The outer-circumference-side lens unit 131 covers the outer circumference side of the first light-emitting unit 113, the second light-emitting unit 114, the third light-emitting unit 115, and the fourth light-emitting unit 116.

The following describes details of the structures of the first light-emitting unit 113, the second light-emitting unit 114, the third light-emitting unit 115, and the fourth light-emitting unit 116.

It should be noted that the following only describes the structure of the first light-emitting unit 113. Since the remaining second light-emitting unit 114, second light-emitting unit 115, and the fourth light-emitting unit 116 have a similar structure to that of the first light-emitting unit 113, the explanation is omitted here.

As shown in FIG. 12, the first light-emitting unit 113 has, above the top face of the first board 118, 24 light emitting elements D1 to D24 of a first group that are white color LEDs and 24 light-emitting elements D25 to D48 of a second group that are light bulb color LEDs. In addition, the first light-emitting unit 113 has metal patterns P1 and P2 on the undersurface of the first board 118. It should be noted that the light-emitting elements D1 to D24 of the first group and the light-emitting elements D25 to D48 of the second group are just an example of the light-emitting elements according to the first embodiment. The metal patterns P1 and P2 are just an example of the metal patterns according to the first embodiment.

The light-emitting elements D1 to D13 of the first group and the light-emitting elements D25 to D37 of the second group are alternately mounted on the edge of the first board 118 in the circumferential direction. Moreover, the light-emitting elements D14 to D24 of the first group and the light-emitting elements D38 to D48 of the second group are alternately mounted on the edge of the first board 118 in the circumferential direction.

The light-emitting elements D1 to D13 of the same group (first group) and the light-emitting elements D25 to D37 of the same group (second group) are alternately mounted in the circumferential direction such that intervals between adjacent light-emitting elements from one of the light-emitting elements D1 to D13 of the first group and corresponding one of the light-emitting elements D25 to D37 of the second group are substantially regular intervals. The light-emitting elements D14 to D24 of the same group (first group) and the light-emitting elements D38 to D48 of the same group (second group) are alternately mounted in the circumferential direction such that intervals between adjacent light-emitting elements from one of the light-emitting elements D14 to D24 of the first group and corresponding one of the light-emitting elements D38 to D48 of the second group are substantially regular intervals. When the intervals between adjacent light-emitting elements from one of the light-emitting elements D1 to D13 or D14 to D24 of the same group (first group) and corresponding one of the light-emitting elements D25 to D37 or D38 to D48 of the same group (second group) are substantially regular intervals, unevenness of light can be controlled.

A first unit connector 132 and a second unit connector 133 are mounted near the edges on both sides in the circumferential direction of the first board 118. Since the first unit connector 132 and the second unit connector 133 are provided near the edges on the both sides in the circumferential direction of the first board 118, the length of an electric wire used to connect between the first light-emitting unit 113, the second light-emitting unit 114, the third light-emitting unit 115, and the fourth light-emitting unit 116 can be as short as possible. It should be noted that the first unit connector 132 and the second unit connector 133 are connected to the terminals according to the first embodiment.

The metal pattern P2 corresponds to a whole area below the light-emitting elements D1 to D7 and D14 to D19 of the first group and the light-emitting elements D25 to D30 and D38 to D42 of the second group. This means that the meal pattern P2 is thermally connected to the light-emitting elements above the metal pattern P2. The metal pattern P1 is aligned with the metal pattern P2 in the circumferential direction, and isolated from the metal pattern P2. The metal pattern P1 corresponds to a whole area below the light-emitting elements D8 to D13 and D20 to D24 of the first group and the light-emitting elements D31 to D37 and D43 to D48 of the second group. This means that the meal pattern P1 is thermally connected to the light-emitting elements above the metal pattern P1. Here, the metal patterns P1 and P2 are aligned in the circumferential direction that is the longitudinal direction of the first board 118.

As shown in FIG. 13, the first light-emitting unit 113 has a parallel circuit of a series circuit of the light-emitting elements D25 to D30 of the second group, a series circuit of the light-emitting elements D31 to D36 of the second group, a series circuit of the light-emitting elements D37 to D42 of the second group, and a series circuit of the light-emitting elements D43 to D48 of the second group.

In the first light-emitting unit 113, a first pin 134 of the first unit connector 132 is connected to each anode of the light-emitting elements D25 to D30 of the second group, the light-emitting elements D31 to D36 of the second group, the light-emitting elements D37 to D42 of the second group, and the light-emitting elements D43 to D48 of the second group.

In the first light-emitting unit 113, a third pin 135 of the second unit connector 133 is connected to each cathode of the light-emitting elements D25 to D30 of the second group, the light-emitting elements D31 to D36 of the second group, the light-emitting elements D37 to D42 of the second group, and the light-emitting elements D43 to D48 of the second group.

The first light-emitting unit 113 has a parallel circuit of a series circuit of the light-emitting elements D1 to D6 of the first group, a series circuit of the light-emitting elements D7 to D12 of the first group, a series circuit of the light-emitting elements D13 to D18 of the first group, and a series circuit of the light-emitting elements D19 to D24 of the first group.

In the first light-emitting unit 113, a fourth pin 136 of the first unit connector 132 is connected to each anode of the light-emitting elements D1 to D6 of the first group, the light-emitting elements D7 to D12 of the first group, the light-emitting elements D13 to D18 of the first group, and the light-emitting elements D19 to D24 of the first group.

In the first light-emitting unit 113, a first pin 137 of the second unit connector 133 is connected to each cathode of the light-emitting elements D1 to D6 of the first group, the light-emitting elements D7 to D12 of the first group, the light-emitting elements D13 to D18 of the first group, and the light-emitting elements D19 to D24 of the first group.

The following describes the light-emitting part 117.

As shown in FIG. 14, the power source unit 129 has a first power supply connector 139. This first power supply connector 139 has a first power supply terminal 138 for supplying power to the anodes of the light-emitting elements D1 to D24 of the first group in the first light-emitting unit 113, the second light-emitting unit 114, the third light-emitting unit 115, and the fourth light-emitting unit 116. Moreover, the first power supply connector 139 has a first earth terminal 140 for connecting the cathodes of the light-emitting elements D1 to D24 of the first group to the earth.

The power source unit 129 has a second power supply connector 142. This second power supply connector 142 has a second power supply terminal 141 for supplying power to the anodes of the light-emitting elements D25 to D48 of the second group in the first light-emitting unit 113, the second light-emitting unit 114, the third light-emitting unit 115, and the fourth light-emitting unit 116. Moreover, the second power supply connector 142 has a second earth terminal 143 for connecting the cathodes of the light-emitting elements D25 to D48 of the second group to the earth.

The first power supply terminal 138 and the second power supply terminal 141 are connected to a first intermediate connector 144. The first earth terminal 140 and the second earth terminal 143 are connected to an eighth intermediate connector 145. The first intermediate connector 144 is connected to the first unit connector 132 of the first light-emitting unit 113. The second unit connector 133 of the first light-emitting unit 113 is connected to a second intermediate connector 147 of a harness 146.

A third intermediate connector 148 of the harness 146 is connected to the first unit connector 132 of the second light-emitting unit 114. The second unit connector 133 of the second light-emitting unit 114 is connected to a fourth intermediate connector 150 of a harness 149.

A fifth intermediate connector 151 of the harness 149 is connected to the first unit connector 132 of the third light-emitting unit 115. The second unit connector 133 of the third light-emitting unit 115 is connected to a sixth intermediate connector 153 of a harness 152.

A seventh intermediate connector 154 of the harness 152 is connected to the first unit connector 132 of the fourth light-emitting unit 116. The second unit connector 133 of the fourth light-emitting unit 116 is connected to the eighth intermediate connector 145.

The following describes lighting operation of the light-emitting part 117.

When the first power supply terminal 138 becomes high level and the first earth terminal 140 becomes low level, in the power source unit 129, a potential difference is caused between the first power supply terminal 138 and the first earth terminal 140. As a result, the light-emitting elements D1 to D24 of the first group included in each of the first light-emitting unit 113, the second light-emitting unit 114, the third light-emitting unit 115, and the fourth light-emitting unit 116 emit light.

On the other hand, when the second power supply terminal 141 becomes high level and the second earth terminal 143 becomes low level, in the power source unit 129, a potential difference is caused between the second power supply terminal 141 and the second earth terminal 143. As a result, the light-emitting elements D25 to D48 of the second group included in each of the first light-emitting unit 113, the second light-emitting unit 114, the third light-emitting unit 115, and the fourth light-emitting unit 116 emit light.

Thus, since the ceiling light 110 of the present embodiment has a light-emitting device of the first embodiment, it is possible to achieve a ceiling light of a small and simple structure in which abnormal light emission and poor connection are reduced.

It should be noted that in the ceiling light 110 according to the present embodiment, the metal patterns P1 and P2 may be formed on the surface of the body 111 as a base with which the undersurface of the first board 118 is in contact, rather than formed on the undersurface of the first board 118 of the first light-emitting unit 113. In other words, the ceiling light 110 may have the first light-emitting unit 113 and the body 111 provided with first light-emitting unit 113. The body 111 may have the metal patterns P1 and P2 on the surface with which the undersurface of the first board 118 of the first light-emitting unit 113 is in contact.

Embodiment 3

Figure 15:
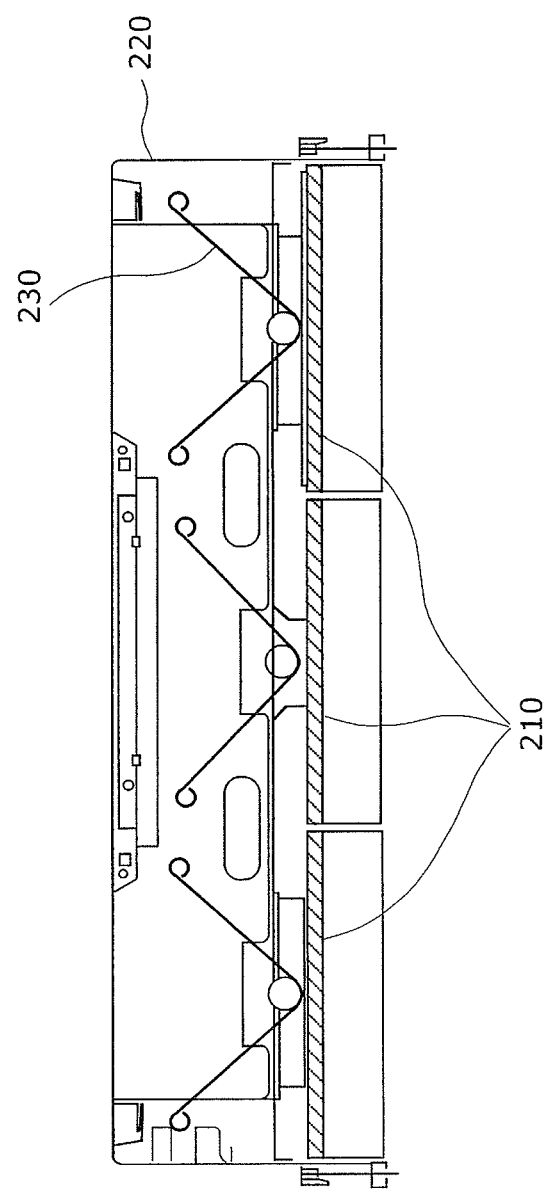
FIG. 15 is a vertical sectional view of a lighting apparatus according to the third embodiment of the present invention.
Figure 16A:
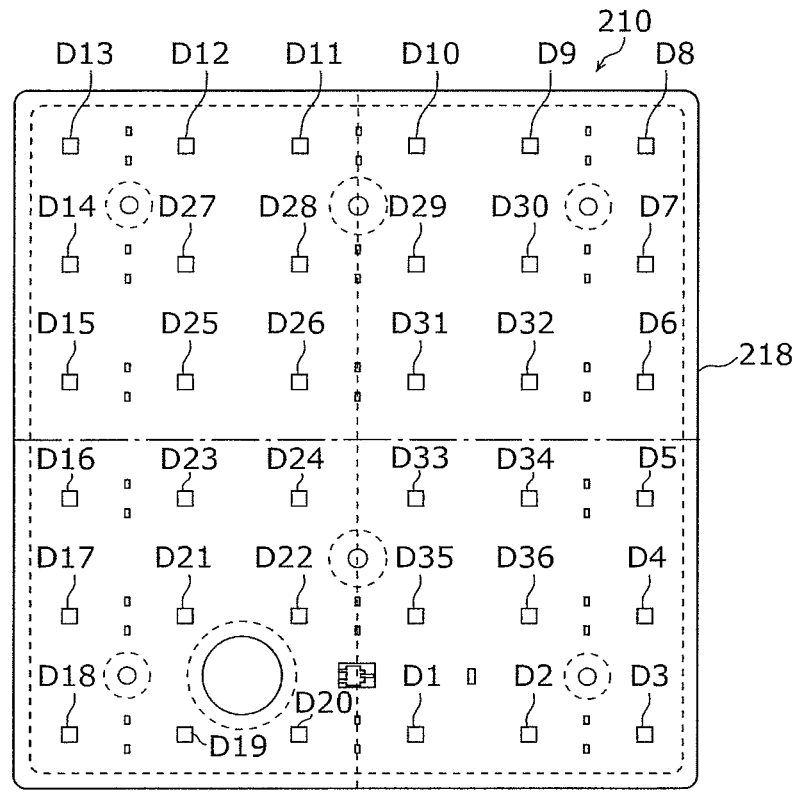
FIG. 16A is a plan view of the top face of the board of a light-emitting unit in a ceiling light according to the third embodiment of the present invention.
Figure 16B:
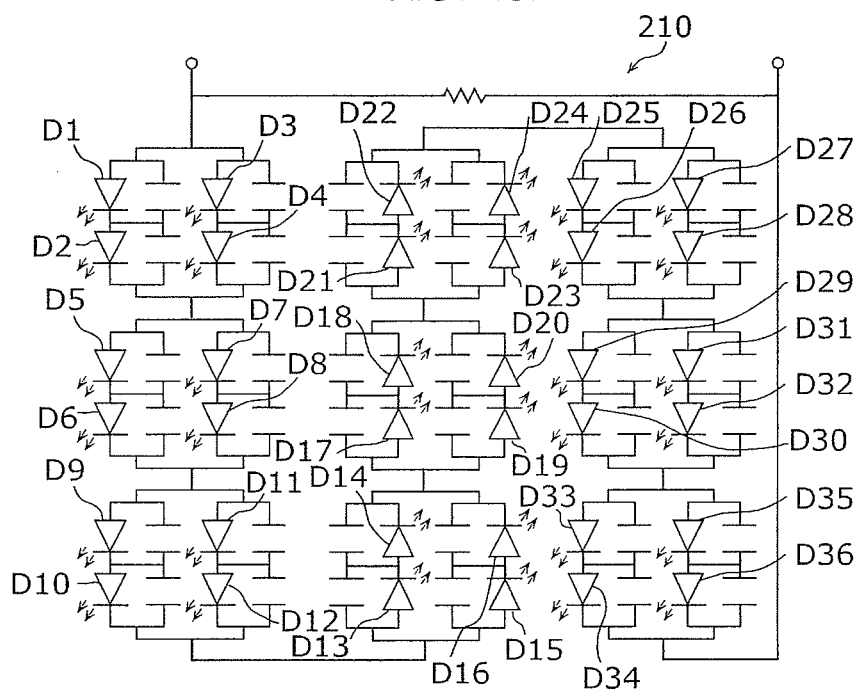
FIG. 16B is a circuit diagram illustrating a circuitry of a light-emitting unit of a lighting apparatus according to the third embodiment of the present invention.
Figure 17A:
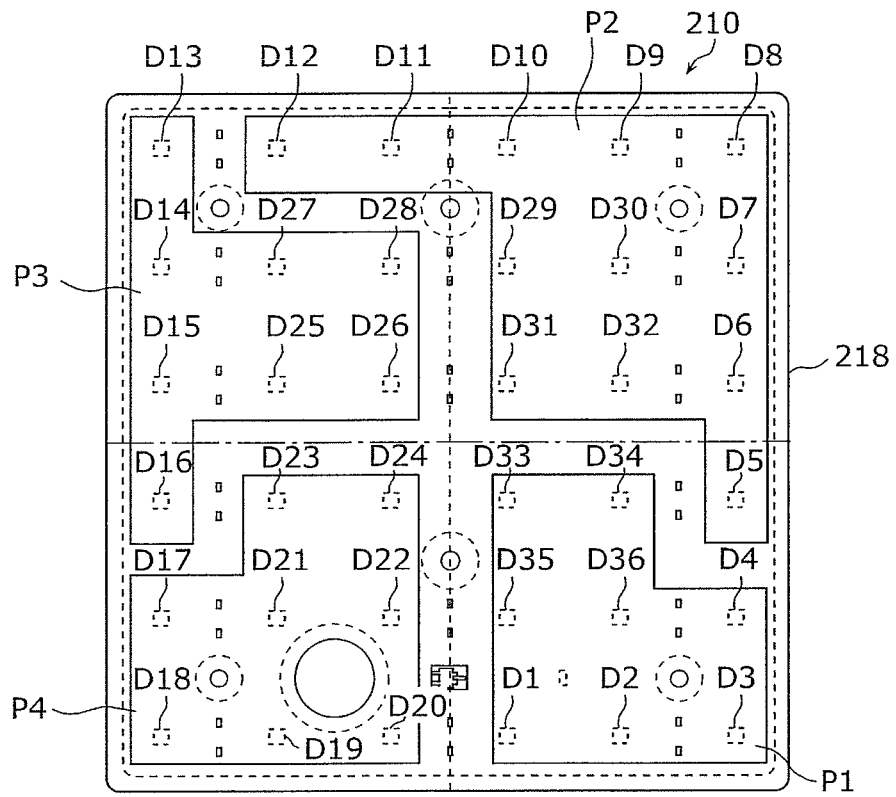
FIG. 17A is a plan view of the undersurface of the board of a light-emitting unit in a ceiling light according to the third embodiment of the present invention.
Figure 17B:
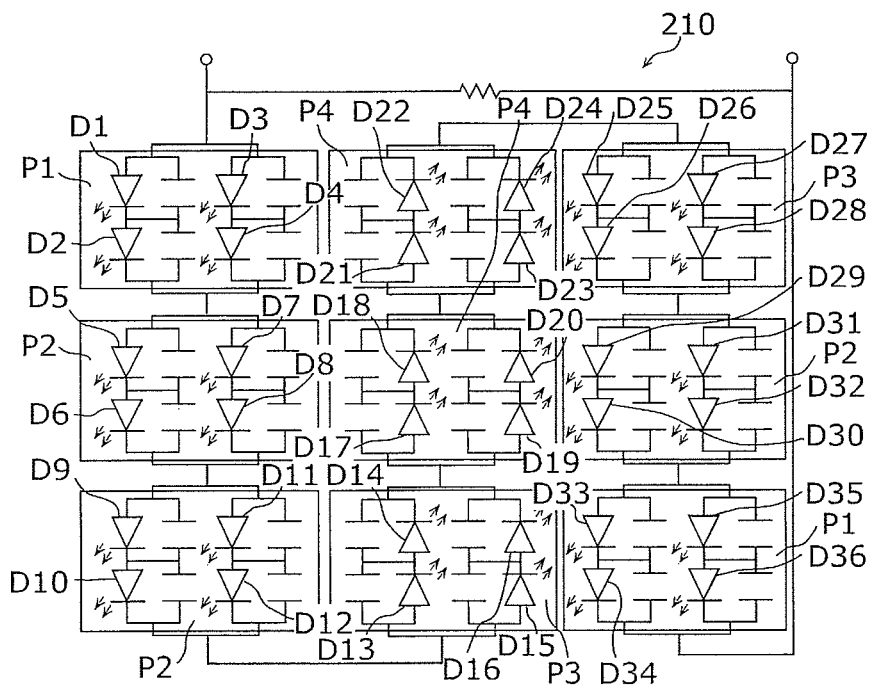
FIG. 17B is a circuit diagram illustrating a circuitry of a light-emitting unit of a lighting apparatus according to the third embodiment of the present invention.

FIG. 15 is a vertical sectional view of a lighting apparatus according to the third embodiment of the present invention. FIG. 16A is a plan view of the top face of a board of a light-emitting unit of the lighting apparatus. FIG. 16B is a circuit diagram illustrating a circuitry of the light-emitting unit of the lighting apparatus. FIG. 17A is a plan view of the top face of the board of the light-emitting unit in the lighting apparatus. FIG. 17B is a circuit diagram illustrating a circuitry of the light-emitting unit of the lighting apparatus.

This lighting apparatus is an example of a lighting apparatus having a light-emitting device according to the first embodiment, and is a lighting apparatus to be embedded in a built-in recess in a system ceiling. The lighting apparatus includes a body 220, a light-emitting unit 210 that is an example of a light-emitting device of the first embodiment, and fixing springs 230 that fix the light-emitting unit 210 to the body 220.

As shown in FIG. 16A, the light-emitting unit 210 includes a board 218 and 36 light-emitting elements D1 to D36 that are white color LEDs mounted above or on the top face of the board 218. Moreover, as shown in FIG. 17A, the light-emitting unit 210 has metal patterns P1 to P4 on the undersurface of the board 218. The board 218 is formed by changing the shape of the board 18 of the first embodiment to, for example, a square shape. It should be noted that the light-emitting elements D1 to D36 are just an example of the light-emitting elements of the first embodiment. The metal patterns P1 to P4 are just an example of the metal patterns of the first embodiment.

The light-emitting elements D1 to D36 are mounted in a matrix (in a reticular pattern) at substantially regular intervals above or on the board 218. Therefore, unevenness of light can be controlled because of substantially regular intervals between the light-emitting elements D1 to D36.

As shown in FIGS. 16B and 17B, the light-emitting unit 210 includes (i) a parallel circuit that connects in parallel between a series circuit of the light-emitting elements D1 and D2 and a series circuit of the light-emitting elements D3 and D4, (ii) a parallel circuit that connects in parallel between a series circuit of the light-emitting elements D5 and D6 and a series circuit of the light-emitting elements D7 and D8, and (iii) a parallel circuit that connects in parallel between a series circuit of the light-emitting elements D9 and D10 and a series circuit of the light-emitting elements D11 and D12. These three parallel circuits are connected in series to form one series circuit. Here, a series circuit of two capacitors is connected in parallel with each of the series circuit of the light-emitting elements D1 and D2, the series circuit of the light-emitting elements D3 and D4, the series circuit of the light-emitting elements D5 and D6, the series circuit of the light-emitting elements D7 and D8, the series circuit of the light-emitting elements D9 and D10, and the series circuit of the light-emitting elements D11 and D12 in order to prevent little light emission from the light-emitting elements D1 to D12 when switching the power supply off (with a single pole switch or a dimmer switch).

Moreover, the light-emitting unit 210 includes (i) a parallel circuit that connects in parallel between a series circuit of the light-emitting elements D13 and D14 and a series circuit of the light-emitting elements D15 and D16, (ii) a parallel circuit that connects in parallel between a series circuit of the light-emitting elements D17 and D18 and a series circuit of the light-emitting elements D19 and D20, and (iii) a parallel circuit that connects in parallel between a series circuit of the light-emitting elements D21 and D22 and a series circuit of the light-emitting elements D23 and D24. These three parallel circuits are connected in series to form one series circuit. Here, a series circuit of two capacitors is connected in parallel with each of the series circuit of the light-emitting elements D13 and D14, the series circuit of the light-emitting elements D15 and D16, the series circuit of the light-emitting elements D17 and D18, the series circuit of the light-emitting elements D19 and D20, the series circuit of the light-emitting elements D21 and D22, and the series circuit of the light-emitting elements D23 and D24 in order to prevent little light emission from the light-emitting elements D13 to D24 when switching the power supply off (with a single pole switch or a dimmer switch).

Moreover, the light-emitting unit 210 includes (i) a parallel circuit that connects in parallel between a series circuit of the light-emitting elements D25 and D26 and a series circuit of the light-emitting elements D27 and D28, (ii) a parallel circuit that connects in parallel between a series circuit of the light-emitting elements D29 and D30 and a series circuit of the light-emitting elements D31 and D32, and (iii) a parallel circuit that connects in parallel between a series circuit of the light-emitting elements D33 and D34 and a series circuit of the light-emitting elements D35 and D36. These three parallel circuits are connected in series to form one series circuit. Here, a series circuit of two capacitors is connected in parallel with each of the series circuit of the light-emitting elements D25 and D26, the series circuit of the light-emitting elements D27 and D28, the series circuit of the light-emitting elements D29 and D30, the series circuit of the light-emitting elements D31 and D32, the series circuit of the light-emitting elements D33 and D34, and the series circuit of the light-emitting elements D35 and D36 in order to prevent little light emission from the light-emitting elements D25 to D36 when switching the power supply off (with a single pole switch or a dimmer switch).

The series circuit of the light-emitting elements D1 to D12, the series circuit of the light-emitting elements D13 to D24, and the series circuit of the light-emitting elements D25 to D36 are connected in series.

As shown in FIGS. 17A and 17B, the metal pattern P1 corresponds to a whole area below the light-emitting elements D1 to D4 and D33 to D36. Thus, the metal pattern P1 is thermally connected to the light-emitting elements above the metal pattern P1. Moreover, the metal pattern P2 corresponds to a below area under the light-emitting elements D5 to D12 and D29 to D32. Thus, the metal pattern P2 is thermally connected to the light-emitting elements above the metal pattern P2. Moreover, the metal pattern P3 corresponds to a whole area below the light-emitting elements D13 to D16 and D25 to D28. Thus, the metal pattern P3 is thermally connected to the light-emitting elements above the metal pattern P3. Moreover, the metal pattern P4 corresponds to a whole area below the light-emitting elements D17 to D24. Thus, the metal pattern P4 is thermally connected to the light-emitting elements above the metal pattern P4.

Thus, since the lighting apparatus of the present embodiment has a light-emitting device of the first embodiment, it is possible to achieve a lighting apparatus of a small and simple structure in which abnormal light emission and poor connection are reduced.

It should be noted that in a lighting apparatus according to the present embodiment, the metal patterns P1 to P4 may be formed on the surface of the body 220 as a base with which the undersurface of the board 218 is in contact, rather than formed on the undersurface of the board 218 of the light-emitting units 210. In other words, the ceiling light 110 may include the light-emitting unit 210 and the body 220 provided with the light-emitting unit 210. The body 220 may have the metal patterns P1 to P4 on the surface with which the undersurface of the board 218 of the light-emitting unit 210 is in contact.

Embodiment 4

Figure 18:
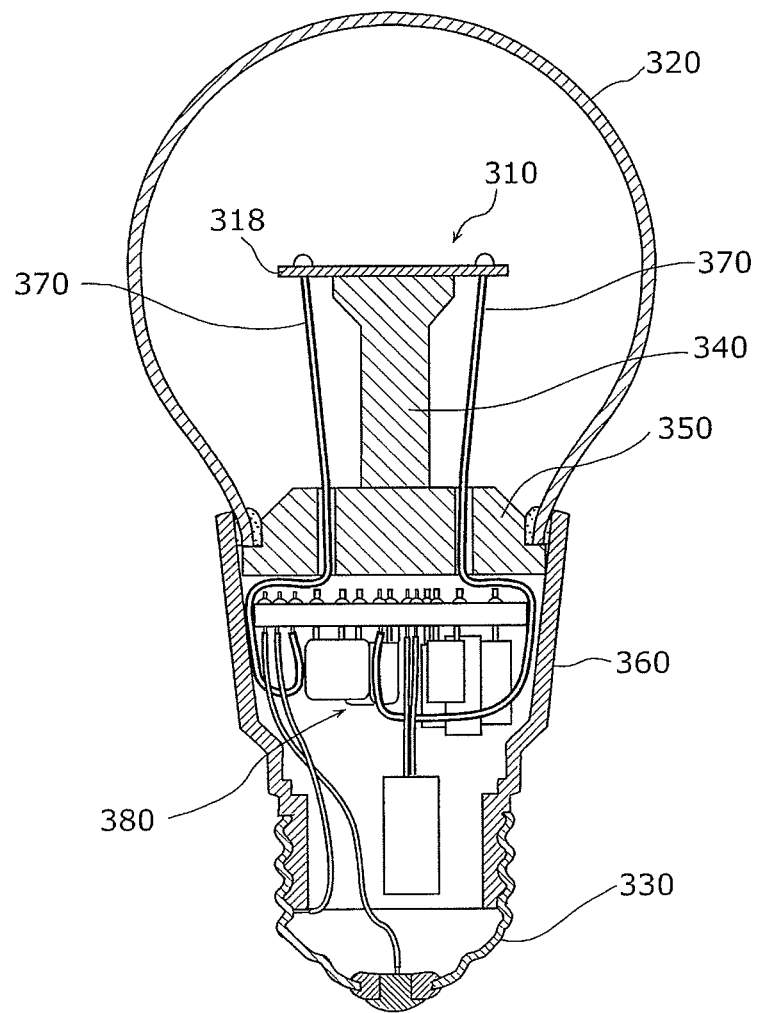
FIG. 18 is a cross-sectional view of a bulb-shaped lamp according to the fourth embodiment of the present invention.

FIG. 18 is a cross-sectional view of a bulb-shaped lamp according to the fourth embodiment of the present invention.

This bulb-shaped lamp is an example of a lighting apparatus having a light-emitting device according to the first embodiment. The bulb-shaped lamp is a bulb-shaped LED lamp that replaces a bulb-shaped fluorescent lamp or an incandescent lamp. The bulb-shaped lamp includes a translucent globe 320, a light-emitting device 310 that is an example of the light-emitting device of the first embodiment, a base 330 that receives electric power from the outside of the lamp, a prop 340, a support plate 350, a resin case 360, a lead wire 370, and a lighting circuit 380. The envelop of the bulb-shaped lamp includes the globe 320, the resin case 360, and the base 330.

Thus, since the bulb-shaped lamp of the present embodiment has a light-emitting device of the first embodiment, it is possible to achieve a bulb-shaped lamp of a small and simple structure in which an abnormal light emission and poor connection are reduced.

It should be noted that in the bulb-shaped lamp according to the present embodiment, the metal patterns for serving only as heat radiation parts may be formed on the surface of the prop 340 as a base with which the undersurface of a board 318 of the light-emitting device 310 is in contact, rather than formed on the undersurface of the board 318 of the light-emitting device 310. In other words, a bulb-shaped lamp may include the light-emitting device 310 and the prop 340 provided with the light-emitting device 310. The prop 340 may have metal patterns for serving only as radiation parts on the surface with which the undersurface of the board 318 of the light-emitting device 310 is in contact.

Embodiment 5

Figure 19:
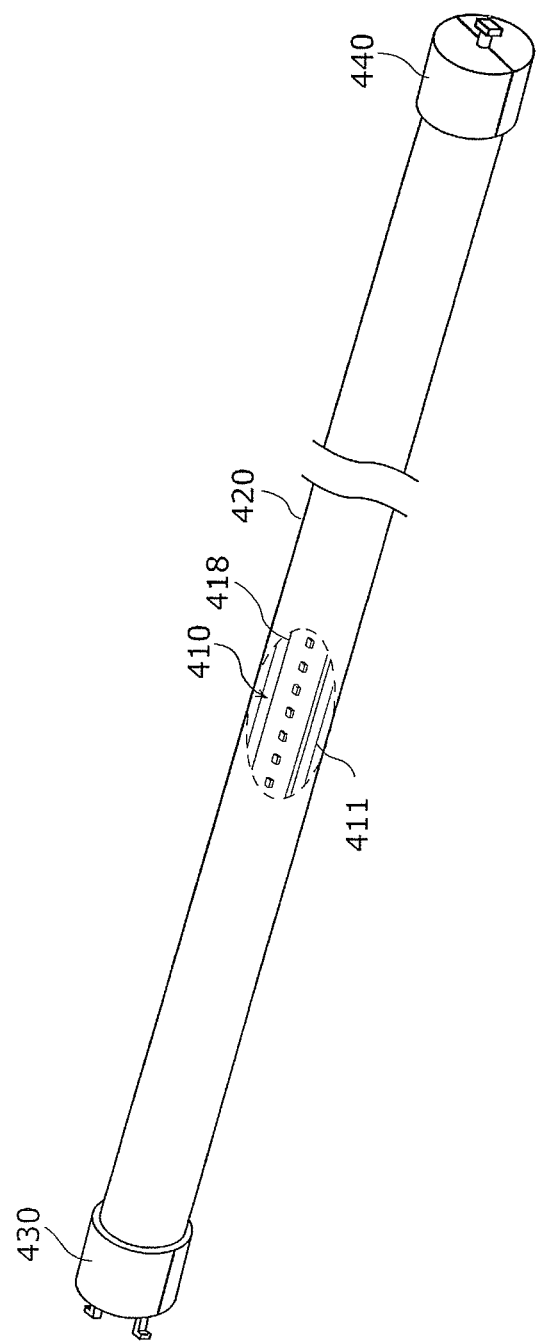
FIG. 19 is an external perspective view of a tubular lamp according to the fifth embodiment of the present invention.

FIG. 19 is an external perspective view of a tubular lamp according to the fifth embodiment of the present invention.

This tubular lamp is an example of a lighting apparatus having the light-emitting device according to the first embodiment, and is a tubular LED lamp that replaces a conventional tubular fluorescent light. The tubular lamp includes a light-emitting device 410, a base 411, a long case 420, a base for power supply 430, and a base not for power supply 440. The light-emitting device 410 is an example of the light-emitting device of the first embodiment. The base 411 has a surface on which the light-emitting device 410 is provided. The long case 420 contains the base 411 and the light-emitting device 410. The base for power supply 430 is provided on one side in the longitudinal direction (tube axis direction) of the case 420. The base not for power supply 440 is provided on the other side in the longitudinal direction of the case 420.

Thus, since the tubular lamp of the present embodiment has a light-emitting device of the first embodiment, it is possible to achieve a tubular lamp of a small and simple structure in which abnormal light emission and poor connection are reduced.

It should be noted that in the tubular lamp according to the present embodiment, the metal patterns for serving only as heat radiation parts may be formed on the surface of the base 411 with which the undersurface of a board 418 of the light-emitting device 410 is in contact, rather than formed on the undersurface of the board 418 of the light-emitting device 410. In other words, a tubular lamp may include the light-emitting device 410 and the base 411 provided with the light-emitting device 410. The base 411 may have metal patterns for serving only as radiation parts on the surface with which the undersurface of the board 418 of the light-emitting device 410 is in contact.

Although a light-emitting device and a lighting apparatus according to the present invention were described above based on the embodiments, the present invention is not limited to these embodiments. Although only some exemplary embodiments of the present invention have been described in detail above, those skilled in the art will readily appreciate that many modifications are possible in the exemplary embodiments without materially departing from the novel teachings and advantages of the present invention. Moreover, structural elements in the embodiments may be optionally combined without departing from the spirit of the prevent invention.

For example, LEDs are exemplified as light-emitting elements in the above embodiment. However, semiconductor light-emitting elements such as semiconductor lasers, organic electroluminescence (EL) light-emitting elements, inorganic electroluminescent (EL) light-emitting elements, or other light-emitting elements may be used.

Moreover, although SMD light-emitting elements are used in the above embodiments, chip-on-board (COB) light-emitting elements may be also used.

Moreover, the metal patterns for serving only as radiation parts are formed under all the light-emitting elements formed above the top face of a board in the embodiments. However, a metal pattern may not be formed under some light-emitting elements.

Moreover, the metal patterns for serving only as radiation parts are aligned in the longitudinal direction of the board in the embodiments. However, in order to control warpage in the lateral direction of the board, the metal pattern for serving only as the radiation parts may be aligned in the lateral direction of the board rather than the longitudinal direction, or the metal patterns may be aligned both in the long and lateral directions of the board.

INDUSTRIAL APPLICABILITY

The present invention can be used for a light-emitting device having light-emitting elements such as LEDs, and can be widely used for a lighting apparatus and others having a light-emitting device.

REFERENCE SIGNS LIST 18, 218, 318, 418 board
28 undersurface
60a to 60l light-emitting element
65 top face
66 wiring pattern
67a to 67c metal pattern
68a to 68d terminal
110 ceiling light
111, 220 body
112 attaching portion
113 first light-emitting unit
114 second light-emitting unit
115 third light-emitting unit
116 fourth light-emitting unit
117 light-emitting part
118 first board
119 second board
120 third board
121 fourth board
122 cover engagement portion
123 cover
124 hole
125 remote control receiver
126 channel setting portion
127 lens
128 board attaching surface
129 power supply unit
130 inner-circumference-side lens unit
131 outer-circumference-side lens unit
132 first unit connector
133 second unit connector
134 first pin
135 third pin
136 fourth pin
137 first pin
138 first power supply terminal
139 first power supply connector
140 first earth terminal
141 second power supply terminal
142 second power supply connector
143 second earth terminal
144 first intermediate connector
145 eighth intermediate connector
146, 149, 152 harness
147 second intermediate connector
148 third intermediate connector
150 fourth intermediate connector
151 fifth intermediate connector
153 sixth intermediate connector
154 seventh intermediate connector
170 ceiling
171 hook ceiling
210 light-emitting unit
230 fixing spring
310, 410 light-emitting device
320 globe
330 base
340 prop
350 support plate
360 resin case
370 lead wire
380 lighting circuit
411 base
420 case
430 base for power supply
440 base not for supply

The invention claimed is:

1. A light-emitting device comprising:
a board;
a plurality of light-emitting elements provided above a top face of the board;
a first metal pattern and a second metal pattern provided on an undersurface of the board; and
a wire pattern provided on the top face of the board, between adjacent light-emitting elements among the plurality of light-emitting elements, the wire pattern connecting the adjacent light-emitting elements,
wherein the plurality of light-emitting elements include:
a first light emitting element and a second light-emitting element interconnected in parallel; and
a third light-emitting element and a fourth light-emitting element, one of which is connected in series with the first light-emitting element and the other of which is connected in series with the second light-emitting element, the third light-emitting element and the fourth light-emitting element being interconnected in parallel and provided above the top face of the board,
the first metal pattern is provided continuously under the first light-emitting element and the second light-emitting element, and
the second metal pattern is provided continuously under the third light-emitting element and the fourth light-emitting element, and isolated from the first metal pattern.

2. The light-emitting device according to claim 1,
wherein the third light-emitting element is connected in series with the first light-emitting element and in parallel with the second light-emitting element, and
the fourth light-emitting element is connected in series with the second light-emitting element and in parallel with the first light-emitting element.

3. The light-emitting device according to claim 2, further comprising:
a fifth light-emitting element provided above the top face of the board, and connected in series with the first light-emitting element and in parallel with the second light-emitting element; and
a sixth light-emitting element provided above the top face of the board, and connected in series with the second light-emitting element and in parallel with the first light-emitting element and the fifth light-emitting element,
wherein the first metal pattern is provided continuously below the first light-emitting element, the second light-emitting element, the fifth light-emitting element, and the sixth light-emitting element.

4. The light-emitting device according to claim 2, further comprising
  a plurality of parallel connection units each including the first light-emitting element and the second light-emitting element,
  wherein the parallel connection units are provided between different pairs of terminals, and
  the first metal pattern is provided continuously under the parallel connection units.

5. The light-emitting device according to claim 1,
  wherein a parallel connection unit of the first light-emitting element and the second light-emitting element is connected in series with a parallel connection unit of the third light-emitting element and the fourth light-emitting element.

6. The light-emitting device according to claim 5, further comprising:
  a fifth light-emitting element provided above the top face of the board, and connected in series with the first light-emitting element and in parallel with the second light-emitting element;
  a sixth light-emitting element provided above the top face of the board, and connected in series with the second light-emitting element and in parallel with the first light-emitting element and the fifth light-emitting element; and
  a third metal pattern provided continuously under the fifth light-emitting element and the sixth light-emitting element, on the undersurface of the board, and isolated from the first metal pattern and the second metal pattern.

7. The light-emitting device according to claim 5, further comprising:
  a fifth light-emitting element and a sixth light-emitting element provided above the top face of the board, and connected in series with the parallel connection unit of the first light-emitting element and the second light-emitting element, the fifth light-emitting element and the sixth light-emitting element being interconnected in parallel; and
  a third metal pattern provided continuously under the fifth light-emitting element and the sixth light-emitting element, on the undersurface of the board, and isolated from the first metal pattern and second metal pattern.

8. The light-emitting device according to claim 5, further comprising
  a fifth light-emitting element and a sixth light-emitting element provided above the top face of the board, and connected in series with the parallel connection unit of the first light-emitting element and the second light-emitting element, the fifth light-emitting element and the sixth light-emitting element being interconnected in parallel,
  wherein the first metal pattern is provided continuously below the first light-emitting element, the second light-emitting element, the fifth light-emitting element and the sixth light-emitting element.

9. The light-emitting device according to claim 5, further comprising
  a plurality of parallel connection units each including the first light-emitting element and the second light-emitting element,
  wherein the parallel connection units are connected in parallel, and
  the first metal pattern is provided continuously under the parallel connection units.

10. The light-emitting device according to claim 1, further comprising terminals and the wiring pattern being among a plurality of wiring patterns, wherein the wiring patterns and terminals supply electric power to the first light-emitting element, the second light-emitting element, the third light-emitting element and the fourth light-emitting element,
  wherein the first metal pattern and the second metal pattern are dielectrically isolated from the wiring patterns.

11. The light-emitting device according to claim 10,
  wherein a total area of metal patterns on the top face of the board including the wiring patterns and the terminals is substantially equal to a total area of metal patterns on the undersurface of the board including the first metal pattern and the second metal pattern.

12. The light-emitting device according to claim 10,
  wherein a thickness of metal patterns on the top face of the board including the wiring patterns and the terminals is substantially equal to a thickness of metal patterns on the undersurface of the board including the first metal pattern and the second metal pattern.

13. The light-emitting device according to claim 1,
  wherein the first metal pattern and the second metal pattern are aligned in a longitudinal direction of the board.

14. The light-emitting device according to claim 1,
  wherein the board comprises fibers extending in a lateral direction of the board, and wherein the first metal pattern and the second metal pattern are aligned in a direction perpendicular to the lateral direction of the board.

15. A lighting apparatus including the light-emitting device according to claim 1.

16. A lighting apparatus comprising:
  a light-emitting device; and
  a base provided with the light-emitting device,
  the light-emitting device including:
  a board;
  a plurality of light-emitting elements provided above a top face of the board;
  a first metal pattern and a second metal pattern provided on an undersurface of the board; and
  a wire pattern provided on the top face of the board, between adjacent light-emitting elements among the plurality of light-emitting elements, the wire pattern connecting the adjacent light-emitting elements,
  wherein the plurality of light-emitting elements include:
  a first light emitting element and a second light-emitting element interconnected in parallel; and
  a third light-emitting element and a fourth light-emitting element, one of which is connected in series with the first light-emitting element and the other of which is connected in series with the second light-emitting element, the third light-emitting element and the fourth light-emitting element being interconnected in parallel and provided above the top face of the board,
  the base including:
  the first metal pattern provided continuously under the first light-emitting element and the second light-emitting element, on a surface with which the undersurface of the board of the light-emitting device is in contact; and
  a second metal pattern provided continuously under the third light-emitting element and the fourth light-emitting element, and isolated from the first metal pattern.

17. The light-emitting device according to claim 11,
  wherein a thickness of metal patterns on the top face of the board including the wiring patterns and the terminals is substantially equal to a thickness of metal patterns on the undersurface of the board including the first metal pattern and the second metal pattern.

* * * * *